US011527603B2

(12) United States Patent
Lee et al.

(10) Patent No.: US 11,527,603 B2
(45) Date of Patent: Dec. 13, 2022

(54) DISPLAY DEVICE INCLUDING CONNECTION PAD CONTACTING SIDE SURFACE OF SIDE TERMINAL HAVING RESISTANCE-REDUCING LAYER

(71) Applicant: Samsung Display Co., Ltd., Yongin-Si (KR)

(72) Inventors: Donghyun Lee, Asan-si (KR); Eui Jeong Kang, Suwon-si (KR); Byoungyong Kim, Seoul (KR); Seung-Soo Ryu, Hwaseong-si (KR); Sanghyeon Song, Seoul (KR); Sang Hyuck Yoon, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 104 days.

(21) Appl. No.: 17/108,354

(22) Filed: Dec. 1, 2020

(65) Prior Publication Data
US 2021/0193789 A1 Jun. 24, 2021

(30) Foreign Application Priority Data

Dec. 19, 2019 (KR) ........................ 10-2019-0170991

(51) Int. Cl.
*H01L 27/32* (2006.01)
*H01L 51/56* (2006.01)
*H01L 51/52* (2006.01)

(52) U.S. Cl.
CPC ........ *H01L 27/3279* (2013.01); *H01L 51/524* (2013.01); *H01L 51/56* (2013.01); *H01L 2227/323* (2013.01)

(58) Field of Classification Search
CPC ............. H01L 27/3276; H01L 27/3279; H01L 2227/323; H01L 51/524; H01L 51/56
(Continued)

(56) References Cited

U.S. PATENT DOCUMENTS

| | | | |
|---|---|---|---|
| 2015/0053931 A1* | 2/2015 | Kim | .................... H01L 27/3276 257/40 |
| 2016/0377905 A1* | 12/2016 | Choi | ...................... H01L 24/32 257/72 |

(Continued)

FOREIGN PATENT DOCUMENTS

| | | |
|---|---|---|
| KR | 1020180127624 A | 11/2018 |
| KR | 1020190076091 A | 7/2019 |
| KR | 1020190083026 A | 7/2019 |

*Primary Examiner* — Matthew E. Gordon
(74) *Attorney, Agent, or Firm* — Cantor Colburn LLP

(57) ABSTRACT

A display device includes a pixel array disposed on a base substrate, a side terminal electrically connected to the pixel array, a connection pad including a first side surface contacting a side surface of the side terminal, and a driving device bonding to a second side surface of the connection pad, where the second side surface is opposite to the first side surface. The side terminal includes a resistance-reducing layer and an upper conductive layer, the resistance-reducing layer includes a first conductive material, the upper conductive layer is disposed on the resistance-reducing layer and includes a second conductive material having an oxidation resistance greater than the first conductive material. A portion of the upper conductive layer is disposed between the connection pad and the resistance-reducing layer such that the resistance-reducing layer is spaced apart from the connection pad.

15 Claims, 19 Drawing Sheets

(58) Field of Classification Search
USPC .......................................................... 257/40
See application file for complete search history.

(56) References Cited

U.S. PATENT DOCUMENTS

2017/0005083 A1* 1/2017 Choi .................... H01L 27/3276
2017/0082888 A1* 3/2017 Park ...................... G02F 1/1339
2019/0109288 A1   4/2019 Li et al.
2020/0212123 A1* 7/2020 Lim .................... H01L 51/5225

* cited by examiner

DISPLAY DEVICE INCLUDING CONNECTION PAD CONTACTING SIDE SURFACE OF SIDE TERMINAL HAVING RESISTANCE-REDUCING LAYER

This application claims priority to Korean Patent Application No. 10-2019-0170991, filed on Dec. 19, 2019, and all the benefits accruing therefrom under 35 U.S.C. § 119, the content of which in its entirety is herein incorporated by reference.

BACKGROUND

1. Field

Embodiments relate to a display device.

2. Description of the Related Art

A display device includes a display panel and a driver providing a driving signal to the display panel. The driver may be included in a driving chip. The driving chip may be combined directly with a substrate of the display panel or may be connected to a pad part through a flexible printed circuit board or the like.

According to a conventional method, the driving chip or the flexible printed circuit board, on which the driving chip is mounted, is bonded to an upper surface of a substrate of the display panel. The area for bonding the driver to the display panel may increase a bezel.

SUMMARY

Embodiments provide a display device having a reduced bezel and improved reliability.

According to an embodiment, a display device includes a pixel array disposed on a base substrate, a side terminal electrically connected to the pixel array, a connection pad including a first side surface contacting a side surface of the side terminal, and a driving device bonding to a second side surface of the connection pad, where the second side surface is opposite to the first side surface. The side terminal includes a resistance-reducing layer and an upper conductive layer, the resistance-reducing layer includes a first conductive material, the upper conductive layer is disposed on the resistance-reducing layer and includes a second conductive material having an oxidation resistance greater than the first conductive material. A portion of the upper conductive layer is disposed between the connection pad and the resistance-reducing layer such that the resistance-reducing layer is spaced apart from the connection pad.

In an embodiment, the first conductive material may include at least one of aluminum and copper.

In an embodiment, the second conductive material may include at least one of silver, titanium, molybdenum, nickel, chrome, and a conductive oxide.

In an embodiment, the resistance-reducing layer may include a main conductive layer and an upper capping layer, the main conductive layer may include the first conductive material, and the upper capping layer may be disposed on the main conductive layer and include the second conductive material.

In an embodiment, the resistance-reducing layer may include a plurality of patterns spaced apart from each other.

In an embodiment, the side terminal may further include a lower conductive layer disposed under the resistance-reducing layer and including the second conductive material.

In an embodiment, the lower conductive layer may include a first lower conductive layer and a second lower conductive layer disposed on the first lower conductive layer.

In an embodiment, an insulation layer may be disposed between the lower conductive layer and the base substrate. A portion of the lower conductive layer may be disposed between the insulation layer and the connection pad such that the insulation layer may be spaced apart from the connection pad.

In an embodiment, the display device may further include a cover substrate disposed on the side terminal, and a filling member disposed between the side terminal and the cover substrate.

In an embodiment, the connection pad may extend to contact a side surface of the filling member.

In an embodiment, the first conductive material may include aluminum, and the second conductive material includes titanium.

In an embodiment, the first conductive material may include aluminum, and the second conductive material includes silver.

According to an embodiment, a display device includes an array substrate including a pixel array and a side terminal, a cover substrate combined with the array substrate, a filling member covering the side terminal and disposed between the array substrate and the cover substrate, and a connection pad contacting a side surface and an upper surface of the side terminal. The pixel array is disposed on a base substrate. The side terminal is electrically connected to the pixel array. The side terminal protrudes from a side surface of the cover substrate in a lateral direction and includes a resistance-reducing layer and an upper conductive layer, the resistance-reducing layer includes a first conductive material, and the upper conductive layer is disposed on the resistance-reducing layer and includes a second conductive material having an oxidation resistance greater than the first conductive material.

According to an embodiment, a display device includes a pixel array disposed on a base substrate, a side terminal electrically connected to the pixel array, and a connection pad contacting a side surface of the side terminal and vertically extending to contact a side surface of the base substrate. The side terminal includes a resistance-reducing layer and an upper conductive layer, the resistance-reducing layer includes a first conductive material, and the upper conductive layer is disposed on the resistance-reducing layer and includes a second conductive material having an oxidation resistance greater than the first conductive material. A portion of the upper conductive layer is disposed between the connection pad and the resistance-reducing layer.

According to embodiments, a driving device is bonded to a side surface of a display panel. Thus, a peripheral area or a bezel of the display panel may be reduced.

Furthermore, a side terminal includes a resistance-reducing layer including a material having a relatively great conductivity, and the resistance-reducing layer is capped by a material having a relatively higher oxidation-resistance. Thus, a resistance of a side-bonding structure may be reduced.

Furthermore, a connection pad may contact an upper surface and a side surface of a side terminal. Thus, resistance increase due to oxidation of the side terminal may be effectively prevented or minimized.

BRIEF DESCRIPTION OF THE DRAWINGS

Aspects of one or more embodiments of the present inventive concept will be more clearly understood from the following detailed description taken in conjunction with the accompanying drawings.

DETAILED DESCRIPTION

Figure 1:
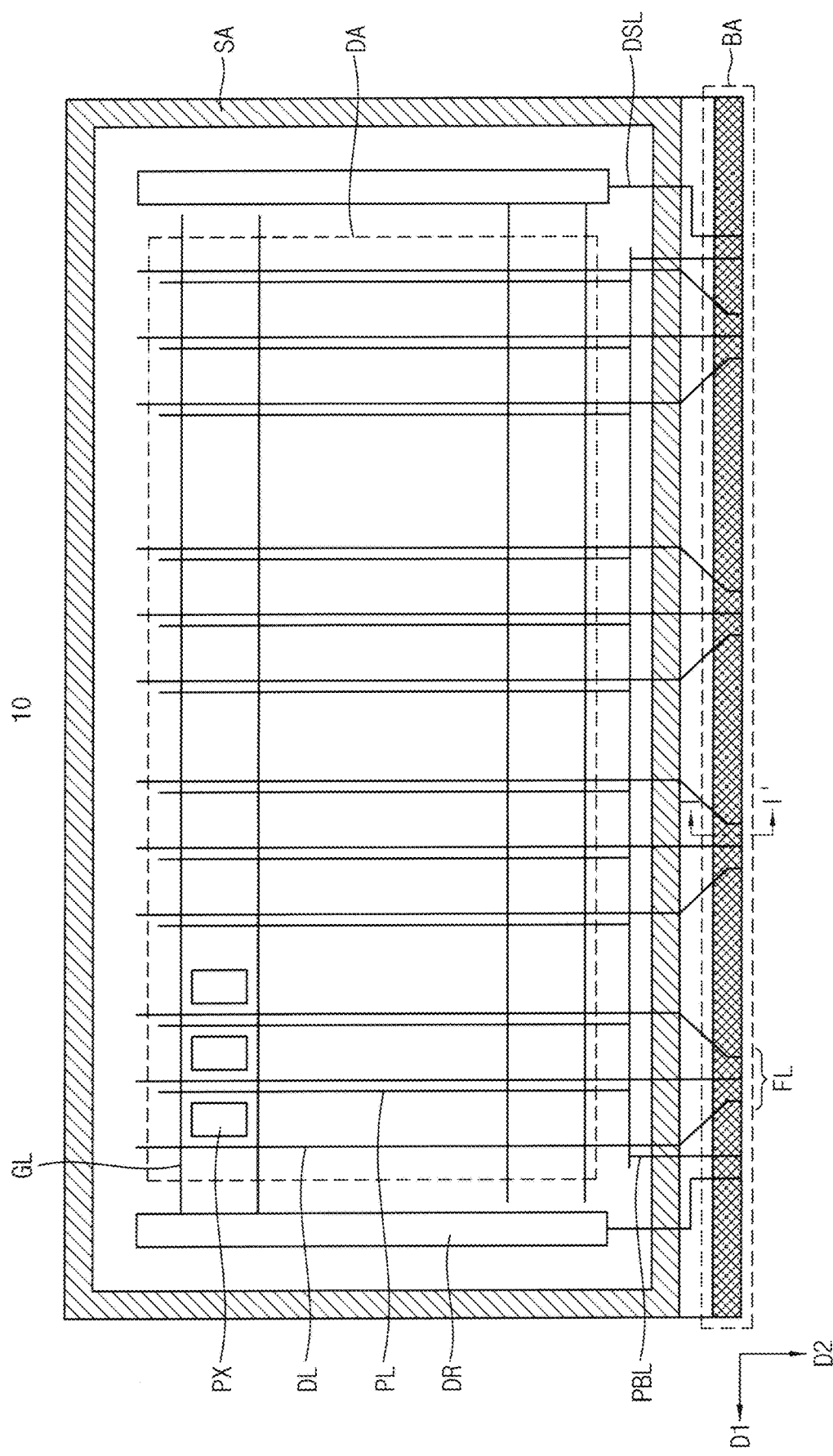
FIG. 1 is a plan view illustrating a display device according to an embodiment.

A display device and a method for manufacturing a display device according to embodiments of the present inventive concept will be described hereinafter with reference to the accompanying drawings, in which some embodiments are shown. It will be understood that when an element is referred to as being "on" another element, it can be directly on the other element or intervening elements may be present therebetween. In contrast, when an element is referred to as being "directly on" another element, there are no intervening elements present. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Figure 2:
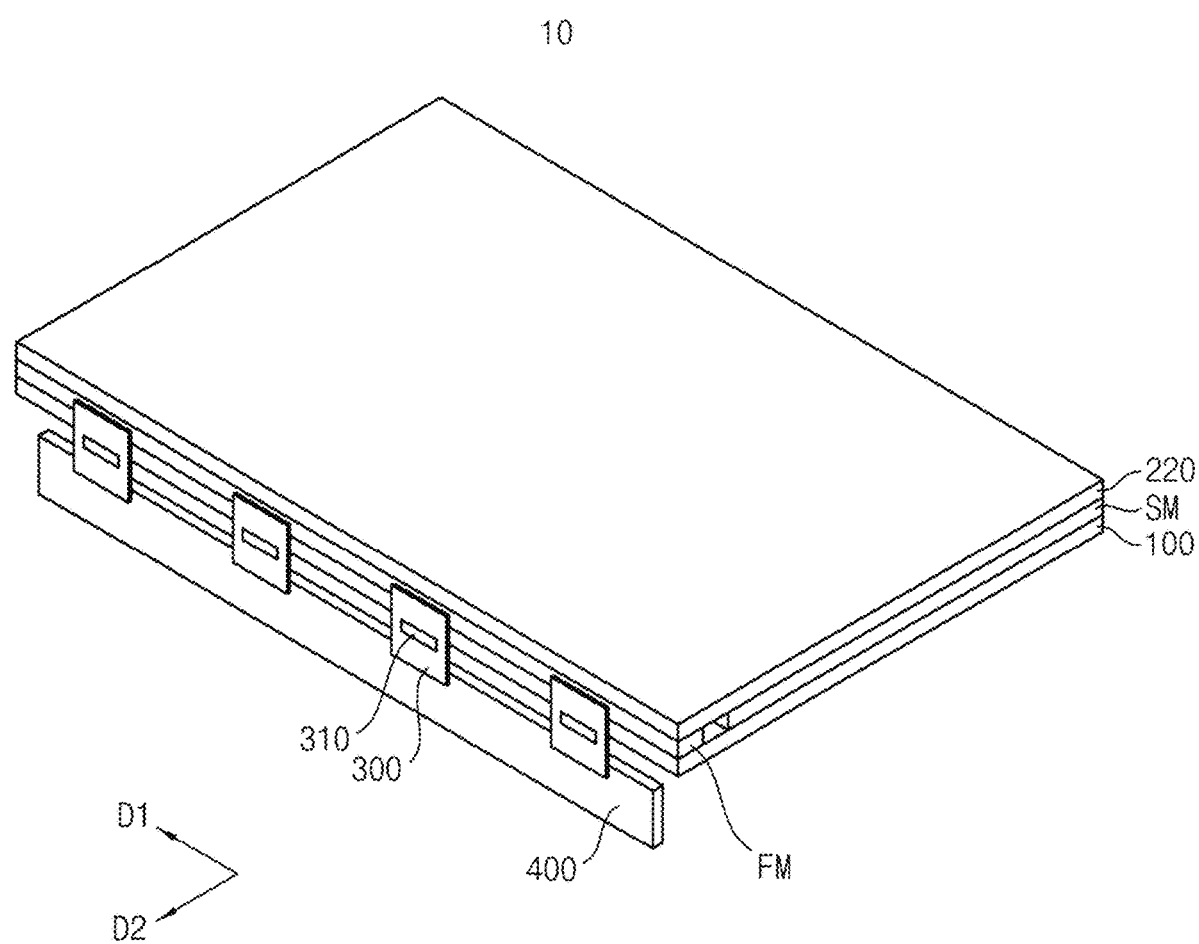
FIG. 2 is a perspective view illustrating a display device according to an embodiment.

FIG. 1 is a plan view illustrating a display device according to an embodiment. FIG. 2 is a perspective view illustrating a display device according to an embodiment.

Referring to FIGS. 1 and 2, a display panel 10 according to an embodiment includes a display area DA and a peripheral area surrounding or adjacent to the display area DA. The display area DA may generate a light or may adjust transmittance of a light provided by an external light source, to display an image. The peripheral area may be defined as an area not displaying an image.

In an embodiment, the display panel 10 may be an organic light-emitting display panel. For example, an array of pixels PX including a light-emitting element may be disposed in the display area DA to generate a light in response to a driving signal. A signal wiring and a power wiring may be disposed in the display area DA to transfer a driving signal and a power to the pixels PX. For example, a gate line GL, a data line DL and a power line PL may be disposed in the display area DA. The gate line GL may extend along a first direction D1 and may provide a gate signal to the pixels PX. The data line DL may extend along a second direction D2 crossing the first direction D1 and may provide a data signal to the pixels PX. The power line PL may extend along the second direction D2 and may provide a power to the pixels PX.

A transfer wiring, a circuit part, or the like may be disposed in the peripheral area. The transfer wiring may transfer a driving signal or a power to the display area DA. The circuit part may generate a driving signal. For example, a driver DR generating a gate signal, a control signal wiring DSL transferring a control signal to the driver DR, a fan-out wiring FL transferring a data signal to the data line DL, a power bus wiring PBL transferring a power to the power line PL or the like may be disposed in the peripheral area.

In an embodiment, the peripheral area may further include a sealing area SA in which a sealing member SM is disposed. The sealing area SA may have a shape surrounding the display area DA.

The transfer wiring may extend to a side end of the peripheral area. An end of the transfer wiring is electrically connected to a side terminal. The side terminal is electrically connected to an external driving device. Thus, the transfer wiring may be electrically connected to the external driving device to receive a driving signal, a control signal, a power, or the like.

A bonding area BA may be defined by an area in which side terminals are disposed. For example, the side terminals may be arranged along the first direction D1 in the bonding area BA. A filling member FM covering the side terminals may be disposed in the bonding area BA.

In an embodiment, the external driving device is bonded to a side surface of the display panel 10.

For example, as illustrated in FIG. 2, the display panel 10 may include an array substrate 100, a cover substrate 220 combined with the array substrate 100, a sealing member SM disposed between the array substrate 100 and the cover substrate 220, and a filling member FM disposed between the array substrate 100 and the cover substrate 220. The filling member FM may extend along the first direction D1.

A side surface of the side terminal or a connection pad connected to the side terminal is exposed through a side surface of the display panel 10. Thus, the external driving device may be bonded to the side surface of the display panel 10 to be electrically connected to the transfer wiring.

For example, the external driving device may include a flexible printed circuit film 300, on which a driving chip 310 is mounted, and a printed circuit board 400 electrically connected to the flexible printed circuit film 300. The driving chip 310 may transfer a data signal to the transfer wiring through the flexible printed circuit film 300. The printed circuit board 400 may transfer a control signal, a power, or the like to the transfer wiring through flexible printed circuit film 300.

Figure 3:
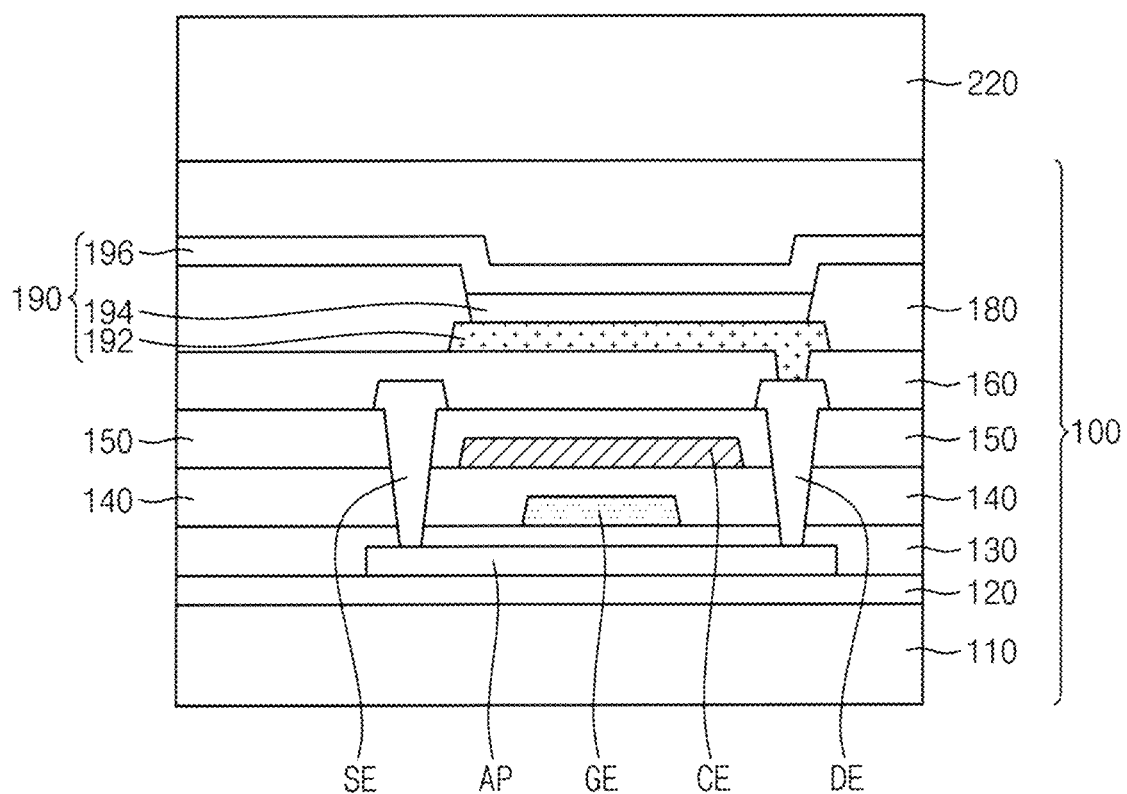
FIG. 3 is a cross-sectional view illustrating a display area of a display device according to an embodiment.

FIG. 3 is a cross-sectional view illustrating a display device according to an embodiment.

Referring to FIG. 3, a pixel unit disposed in the display area DA may include a driving element disposed on a base substrate 110 and a light-emitting element electrically connected to the driving element. In an embodiment, the light-emitting element may be an organic light-emitting diode. The driving element may include at least one thin film transistor.

A buffer layer 120 may be disposed on the base substrate 110. An active pattern AP may be disposed on the buffer layer 120.

For example, the base substrate 110 may include glass, quartz, sapphire, a polymeric material, or the like. In an embodiment, the base substrate 110 may include a transparent rigid material such as glass.

The buffer layer 120 may prevent or reduce the permeation of impurities, humidity, or external gas from underneath of the base substrate 110, and may reduce roughness of an upper surface of the base substrate 110. For example, the buffer layer 120 may include an inorganic material such as oxide, nitride, or the like.

A first gate metal pattern including a gate electrode GE may be disposed on the active pattern AP. A first insulation layer 130 may be disposed between the active pattern AP and the gate electrode GE.

A second gate metal pattern including a capacitor electrode pattern CE may be disposed on the first gate metal pattern. The second gate metal pattern may include a capacitor electrode for forming a capacitor, a wiring for transferring signals, or the like.

A second insulation layer 140 may be disposed between the first gate metal pattern and the second gate metal pattern. A third insulation layer 150 may be disposed on the second gate metal pattern.

In an embodiment, for example, the active pattern AP may include silicon or a metal oxide semiconductor. In an embodiment, the active pattern AP may include polycrystalline silicon (polysilicon), which may be doped with n-type impurities or p-type impurities.

In another embodiment or in another transistor that is not illustrated, the active pattern AP may include a metal oxide semiconductor. For example, the active pattern AP may include two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), or magnesium (Mg). For example, the active pattern AP may include zinc oxide (ZnOx), gallium oxide (GaOx), titanium oxide (TiOx), tin oxide (SnOx), indium oxide (InOx), indium-gallium oxide ("IGO"), indium-zinc oxide ("IZO"), indium tin oxide ("ITO"), gallium zinc oxide ("GZO"), zinc magnesium oxide ("ZMO"), zinc tin oxide ("ZTO"), zinc zirconium oxide (ZnZrxOy), indium-gallium-zinc oxide ("IGZO"), indium-zinc-tin oxide ("IZTO"), indium-gallium-hafnium oxide (IGHO), tin-aluminum-zinc oxide ("TAZO"), indium-gallium-tin oxide ("IGTO") or the like.

The first insulation layer 130, the second insulation layer 140, and the third insulation layer 150 may include silicon oxide, silicon nitride, silicon oxynitride, or a combination thereof. Furthermore, the first insulation layer 130, the second insulation layer 140 and the third insulation layer 150 may include an insulating metal oxide such as aluminum oxide, tantalum oxide, hafnium oxide, zirconium oxide, titanium oxide or the like. For example, each of the first insulation layer 130, the second insulation layer 140 and the third insulation layer 150 may have a single-layered structure or a multi-layered structure including silicon nitride and/or silicon oxide, or may have different structures from each other.

The gate electrode GE and the capacitor electrode pattern CE may include a metal, a metal alloy, a metal nitride, a conductive metal oxide, or the like. For example, each of the gate electrode GE and the capacitor electrode pattern CE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 150. The first source metal pattern may include a source pattern SE and a drain pattern DE, which electrically contact the active pattern AP. The source pattern SE and the drain pattern DE may pass through the insulation layers (i.e., the first insulation layer 130, the second insulation layer 140, and the third insulation layer 150) disposed thereunder to contact the active pattern AP, respectively.

The first source metal pattern may include a metal, a metal alloy, a metal nitride, a conductive metal oxide, or the like. For example, the first source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an embodiment, the first source metal pattern may have a multi-layered structure including an aluminum layer.

A fourth insulation layer 160 may be disposed on the first source metal pattern. The fourth insulation layer 160 may include an organic material. For example, the fourth insulation layer 160 may include an organic insulation material such as a phenolic resin, an acryl resin, a polyimide resin, a polyamide resin, a siloxane resin, an epoxy resin or the like.

An organic light-emitting diode 190 may be disposed on the fourth insulation layer 160. The organic light-emitting diode 190 may include a first electrode 192 electrically contacting the drain pattern DE, an organic light-emitting layer 194 disposed on the first electrode 192, and a second electrode 196 disposed on the organic light-emitting layer 194. The organic light-emitting layer 194 of the organic light-emitting diode 190 may be disposed at least in an opening defined by a pixel-defining layer 180 disposed on the fourth insulation layer 160. The first electrode 192 may be a lower electrode of the organic light-emitting diode 190, and the second electrode 196 may be an upper electrode of the organic light-emitting diode 190.

The first electrode 192 may function as an anode. For example, the first electrode 192 may be a transmissive electrode or a reflecting electrode according to an emission type of the display device. When the first electrode 192 is a transmissive electrode, the first electrode 192 may include indium tin oxide, indium zinc oxide, zinc tin oxide, indium oxide, zinc oxide, tin oxide or the like. When the first electrode 192 is a reflecting electrode, the first electrode 192 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmissive electrode.

The pixel-defining layer 180 defines the opening overlapping at least a portion of the first electrode 192. For example, the pixel-defining layer 180 may include an organic insulating material.

The organic light-emitting layer 194 may include at least an emission layer, and may further include at least one of a hole injection layer ("HIL"), a hole transporting layer ("HTL"), an electron transporting layer ("ETL") and an electron injection layer ("EIL"). For example, the organic light-emitting layer 194 may include a low molecular weight organic compound or a high molecular weight organic compound.

In an embodiment, the organic light-emitting layer 194 may emit a red light, a green light, or a blue light. In another embodiment, the organic light-emitting layer 194 may emit a white light. The organic light-emitting layer 194 emitting a white light may have a multi-layer structure including a red-emitting layer, a green-emitting layer, and a blue-emitting layer, or a single-layer structure including a mixture of a red-emitting material, a green-emitting material, and a blue-emitting material.

The second electrode 196 may be a transmissive electrode or a reflecting electrode according to an emission type of the display device. For example, the second electrode 196 may include a metal, a metal alloy, a metal nitride, a metal fluoride, a conductive metal oxide or a combination thereof.

For example, the second electrode 196 may be formed as a common layer extending continuously over a plurality of pixels in the display area DA. In an embodiment, the organic light-emitting layer 194 may have an isolated patter shape. However, embodiments according to the invention are not limited thereto. For example, at least one layer of the organic light-emitting layer 194 may be formed as a common layer extending continuously over a plurality of pixels in the display area DA in another embodiment.

A cover substrate 220 is disposed on the organic light-emitting diode 190. For example, the cover substrate 220 may include glass, quartz, sapphire, a polymeric material, or the like. In an embodiment, the cover substrate 220 may include a transparent rigid material such as glass.

In an embodiment, for example, a spacer may be disposed under the cover substrate 220 to support the cover substrate 220. The spacer may be disposed between the cover substrate 220 and the organic light-emitting diode 190 or between the pixel-defining layer 180 and the second electrode 196 of the organic light-emitting diode 190.

A space between the cover substrate 220 and the organic light-emitting diode 190 may have a vacuum state or may be filled with a gas or a sealing member. The sealing member may include an organic layer, an inorganic layer or a combination thereof.

Figure 4:
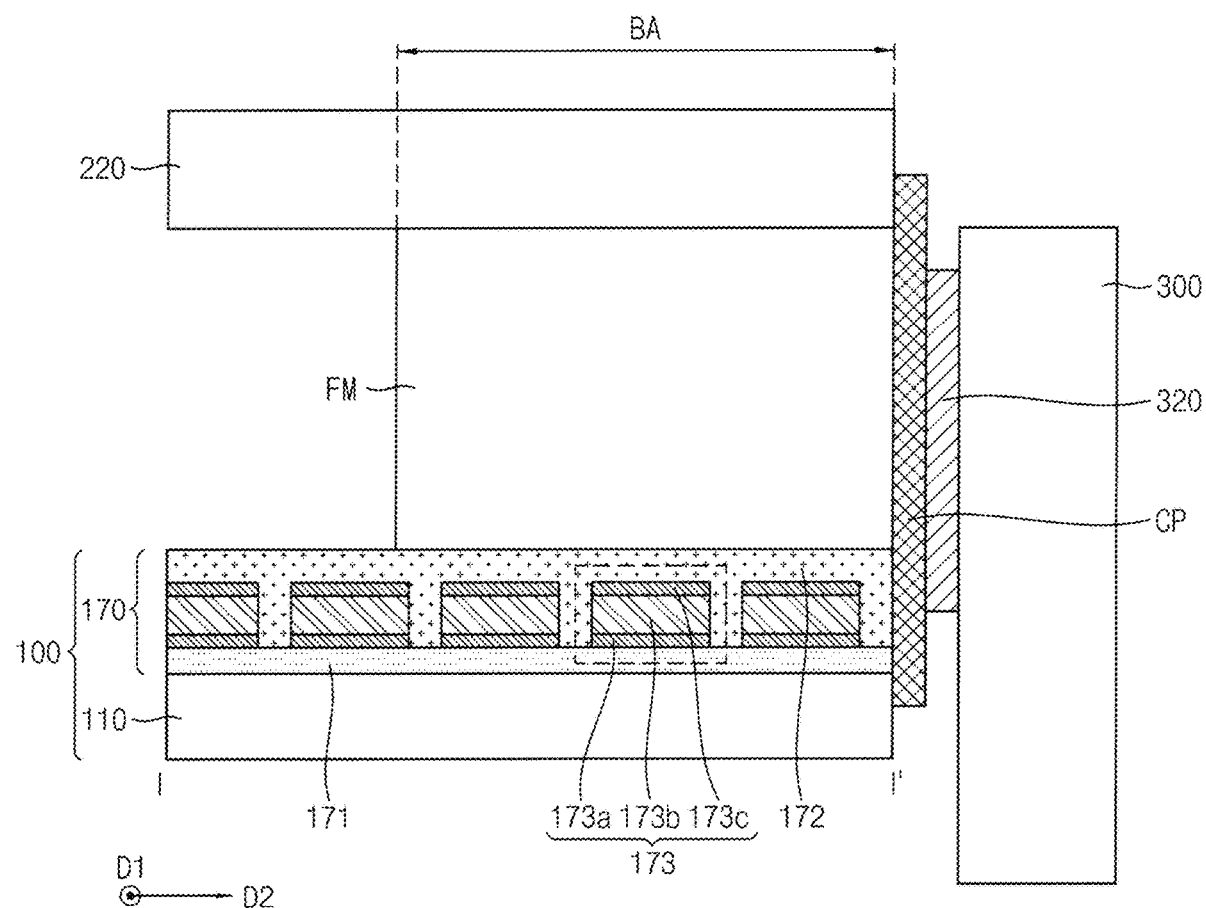
FIG. 4 is a cross-sectional view illustrating a bonding area of a display device taken along line I-I' of FIG. 1 according to an embodiment.

FIG. 4 is a cross-sectional view illustrating a bonding area of a display device taken along line I-I' of FIG. 1 according to an embodiment.

Referring to FIG. 4, a side terminal 170 is disposed in the bonding area BA. The side terminal 170 may be electrically connected to a transfer wiring. For example, the transfer wiring may be a fan-out wiring transferring a data signal, and may be formed from the same layer as the first gate metal pattern, the second gate metal pattern, or a combination thereof.

However, embodiments according to the invention are not limited thereto. The transfer wiring may be the power bus wiring PBL, the control signal wiring DSL, or a bridge wiring electrically connected thereto.

The side terminal 170 may extend to a side surface of the display panel 10 to be exposed to an exterior. In an embodiment, the side terminal 170 may have a multi-layered structure including a plurality of conductive layers.

In an embodiment, the side terminal 170 includes a lower conductive layer 171, an upper conductive layer 172, and a resistance-reducing layer 173 disposed between the lower conductive layer 171 and the upper conductive layer 172.

The resistance-reducing layer 173 may include a metal having a relatively great conductivity. For example, the resistance-reducing layer 173 may include aluminum, copper, or a combination thereof.

In an embodiment, the resistance-reducing layer 173 may have a multi-layered structure. For example, the resistance-reducing layer 173 may include a main conductive layer 173b and an upper capping layer 173c covering an upper surface of the main conductive layer 173b. The resistance-reducing layer 173 may further include a lower capping layer 173a covering a lower surface of the main conductive layer 173b.

The main conductive layer 173b may include a metal having a relatively great conductivity. For example, the main conductive layer 173b may include aluminum, copper, or a combination thereof. The capping layers 173a and 173c include a material having a greater oxidation-resistance than the main conductive layer 173b. For example, the capping layers 173a and 173c may include silver, titanium, molybdenum, nickel, chrome, a conductive oxide, or a combination thereof.

In an embodiment, the main conductive layer 173b may include aluminum, and the capping layers 173a and 173c may include titanium. For example, the resistance-reducing layer 173 may be formed from the same layer as the first source metal pattern.

In an embodiment, the lower conductive layer 171 may include a material having a greater oxidation-resistance than the main conductive layer 173b. For example, the lower conductive layer 171 may include silver, titanium, molybdenum, nickel, chrome, a conductive oxide, or a combination thereof. For example, the lower conductive layer 171 may be formed from the same layer as the first gate metal pattern, the second gate metal pattern, or a combination thereof.

In an embodiment, the upper conductive layer 172 may include a material having a greater oxidation-resistance than the main conductive layer 173b. For example, the upper conductive layer 172 may include silver, titanium, molybdenum, nickel, chrome, a conductive oxide, or a combination thereof.

In an embodiment, the upper conductive layer 172 may be formed from the same layer as the lower electrode 192 of the organic light-emitting diode 190. For example, the upper conductive layer 172 may include silver, or may include a combination of silver and a conductive oxide. For example, the conductive oxide may include indium tin oxide, indium zinc oxide, zinc tin oxide, indium oxide, zinc oxide, tin oxide, or a combination thereof.

Hereinafter, the high-conductive material included in the resistance-reducing layer 173 may be referred as to a first conductive material, and the high-oxidation-resistance material included in the capping layers or in the upper conductive layer may be referred as to a second conductive material.

In an embodiment, a filling member FM is disposed between the array substrate 100 and the cover substrate 220. The filling member FM may fill a space between the side terminal 170 and the cover substrate 220, in the bonding area BA. The filling member FM may prevent impurities from entering the display panel 10 or may prevent undercut formed at the side terminal 170, when the side surface of the display panel is polished (or grinded).

In an embodiment, the filling member FM may include an inorganic material. For example, the filling member FM may be formed from glass frit, ceramic frit, or the like. In view of process efficiency, the filling member FM and the sealing member SM may be preferably formed from the same material, for example, glass frit.

In an embodiment, a frit paste may be coated on the bonding area BA, and then sintered by a UV ray, laser, or the like to form the filling member FM. For example, the filling member FM may be formed in the same process as the sealing member SM.

In an embodiment, the filling member FM may be spaced apart from the sealing member SM. However, embodiments according to the invention are not limited thereto. For example, the filling member FM may be connected to the sealing member SM, or may be a portion of the sealing member SM in another embodiment.

In another embodiment, the filling member FM may include a polymeric material formed from a curable resin. For example, the curable resin may include an epoxy resin, a silicone resin, an acrylic resin, an urethane resin, a phenolic resin, or the like. The filling member FM including a polymeric material may be provided between the array substrate 100 and the cover substrate 220 before the display panel is polished and after the display panel is scribed.

In an embodiment, insulation layers including an organic material may be removed in an area overlapping the filling member FM and the sealing member SM. When the insulation layers including an organic material are disposed in the area overlapping the sealing member SM and the filling member FM, outgas may be caused by heat in the process of curing or sintering the sealing member SM and the filling member FM.

In an embodiment, insulation layers including an inorganic material may be removed in an area where the side terminal 170 is exposed. When the insulation layers including an inorganic material are exposed, cracks of the insulation layers may be caused in the process of polishing the display panel 10, or a contact resistance between a connection pad CP and the side terminal 170 may be increased by inorganic particles generated from the insluation layers.

The connection pad CP may be disposed on a side surface of the display panel 10. The connection pad CP may contact the side terminal 170. The connection pad CP may extend along a vertical direction (i.e., a thickness direction of the base substrate 110). For example, the connection pad CP may extend along a vertical direction to cover at least a portion of a side surface of the base substrate 110 or the cover substrate 220. For example, a first side surface of the connection pad CP may contact the side terminal 170, and the flexible printed circuit film 300 may be bonded to a second side surface of the connection pad CP, which is opposited to the first side surface.

The connection pad CP may include a metal. For example, a metal layer may be formed by depositing a metal such as gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or the like. The metal layer may be patterned, for example, by laser to form the connection pad CP. However, embodiments according to the invention are not limited thereto. For example, a metal pattern may be directly formed by using a mask defining an opening in another embodiment.

The connection pad CP may be bonded to a flexible printed circuit film 300 by a conductive connection member 320.

The conductive connection member 320 may be formed by various methods. For example, the conductive connection member 320 may be an anisotropic conductive film ("ACF") having conductive particles dispersed therein. In another embodiment, the conductive connection member 320 may be a conductive bump bonded to the connection pad CP, for example, by supersonic welding or the like. However, embodiments according to the invention are not limited thereto, and various conventional boding methods may be used for bonding the connection pad CP to the flexible printed circuit film 300 and for forming the conductive connection member 320.

In an embodiment, the side surface of the side terminal 170 contacts the connection pad CP. In an embodiment, the upper conductive layer 172 of the side terminal 170 may cover a side surface of the resistance-reducing layer 173. Thus, the main conductive layer 173b, which includes a metal, such as aluminum, having a relatively low oxidation resistance, may not be exposed. Thus, the increase of resistance due to aluminum oxidation may be prevented. Thus, the resistance-reducing layer 173 may be spaced apart from the connection pad CP.

In an embodiment, the resistance-reducing layer 173 may include a plurality of patterns spaced apart from each other along the second direction D2 toward the display area DA. For example, adjacent patterns may be spaced apart from each other by a distance of 1 micrometers ($\mu$m) to 10 $\mu$m. The space between patterns may be filled with the upper conductive layer 172.

It may be difficult to finely control the processes of scribing and polishing the display panel 10 when a side bonding structure is formed. Thus, when actual positions where the display panel 10 is scribed or polished may be different from predetermined positions, a side surface of the main conductive layer 173b may be exposed by accident. In an embodiment, since the resistance-reducing layer 173 includes a plurality of patterns spaced apart from each other, exposure of the main conductive layer 173b may be prevented. For example, when the main conductive layer 173b is exposed to the outside as a result of a first polishing process, the exposed main conductive layer 173b may be removed through an additional polishing process such that the upper conductive layer 172 may be exposed.

In an embodiment, the resistance-reducing layer 173 may have a multi-layered structure. However, embodiments according to the invention are not limited thereto. The resistance-reducing layer 173 may have a single-layered structure including a high-conductive metal such as aluminum, copper or the like, and may be capped by an upper conductive layer in another embodiment.

According to an embodiment, a driving device is bonded to a side surface of a display panel. Thus, a peripheral area or a bezel of the display panel may be reduced.

Furthermore, a side terminal includes a resistance-reducing layer including a material having a relatively great conductivity, and the resistance-reducing layer is capped by a material having a relatively high oxidation-resistance. Thus, a resistance of a side-bonding structure may be reduced.

FIGS. 5, 6, 7, 8, 9 and 10 are cross-sectional views illustrating a method for manufacturing a display device according to an embodiment. FIGS. 5, 6, 7, 8, 9 and 10 may illustrate a bonding area of a display device.

Figure 5:
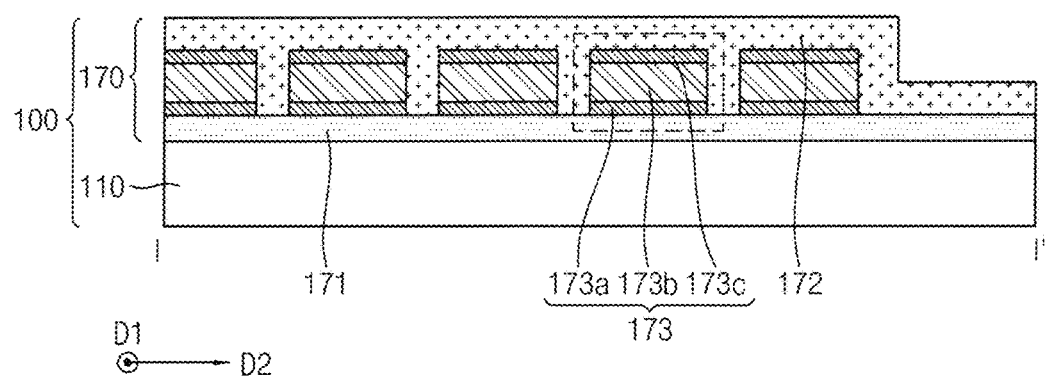
FIGS. 5, 6, 7, 8, 9 and 10 are cross-sectional views illustrating a method for manufacturing a display device according to an embodiment.

Referring to FIG. 5, a side terminal 170 is formed on a base substrate 110.

In an embodiment, the side terminal 170 includes a lower conductive layer 171, an upper conductive layer 172 and a resistance-reducing layer 173 disposed between the lower conductive layer 171 and the upper conductive layer 172. The resistance-reducing layer 173 may include a plurality of patterns spaced apart from each other along the second direction D2.

Each of the patterns may include a main conductive layer 173b, an upper capping layer 173c covering at least an upper surface of the main conductive layer 173b and a lower capping layer 173a covering a lower surface of the main conductive layer 173b.

In an embodiment, the lower conductive layer 171 may be formed from the same layer as a first gate metal pattern or a second gate metal pattern, which is disposed in a display area. The resistance-reducing layer 173 may be formed from the same layer as a source metal pattern disposed in the display area. The upper conductive layer 172 may be formed from the same layer as a lower electrode of an organic light-emitting diode disposed in the display area.

In an embodiment, the patterns of the resistance-reducing layer 173 may be formed through dry-etching so that the patterns of the resistance-reducing layer 173 may have a greater taper angle. When the patterns of the resistance-reducing layer 173 have a vertically-extending side surface, the upper conductive layer 172 may extend along a vertical direction (i.e., a thickness direction of the base substrate 110) between the patterns adjacent to each other. Thus, a thickness of the upper conductive layer 172 may be increased between the adjacent patterns. Thus, an exposed area of the upper conductive layer 172 may be increased.

In an embodiment, an insulation layer between metal layers may be removed in the bonding area. However, embodiments according to the invention are not limited thereto. For example, at least a portion of the insulation layer may remain in the bonding area as desired in another embodiment.

The base substrate 110, a pixel array formed on the base substrate 110 and a structure formed in the bonding area may be referred as to an array substrate 100.

Figure 6:
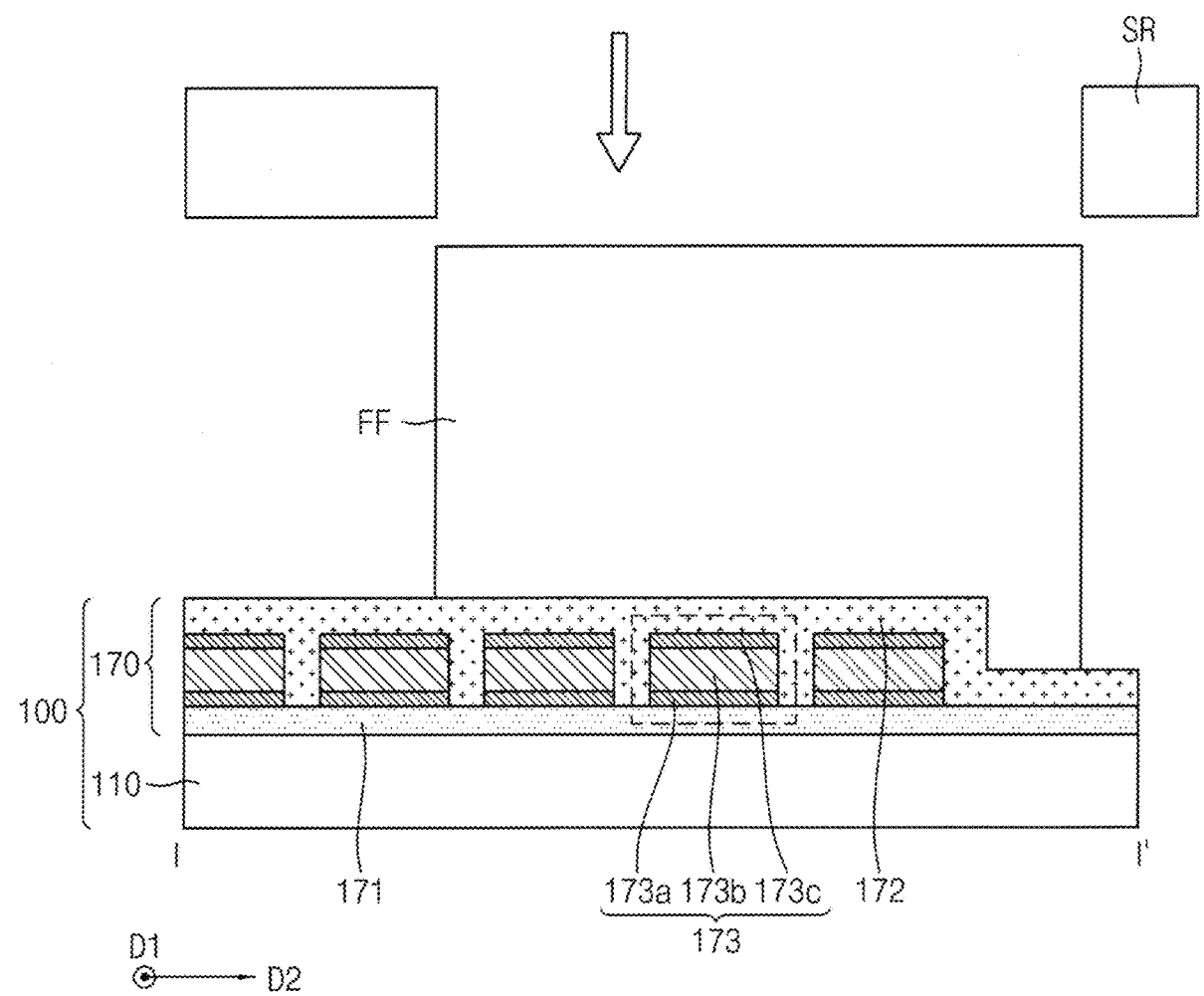

Referring to FIG. 6, a filling frit FF is provided on the array substrate 100.

In an embodiment, a screen printing method or a dispensing method may be used for providing the filling frit FF on the array substrate 100. For example, a screen SR is disposed on the array substrate 100. The screen SR may have an opening corresponding a shape and a dimension of a filling member. A frit paste is provided on an area corresponding to the filling member through the opening thereby forming the filling frit FF.

For example, the filling frit FF may include glass frit. For example, the glass frit may include an oxide powder, a binder and a solvent. For example, the oxide powder may include lead oxide (PbO), silicon oxide ($SiO_2$), zinc oxide (ZnO), bismuth oxide ($Bi_2O_3$), boron oxide ($B_2O_3$, $B_2O_8$), iron oxide ($Fe_2O_3$), aluminum oxide ($Al_2O_3$) or a combination thereof.

Figure 7:
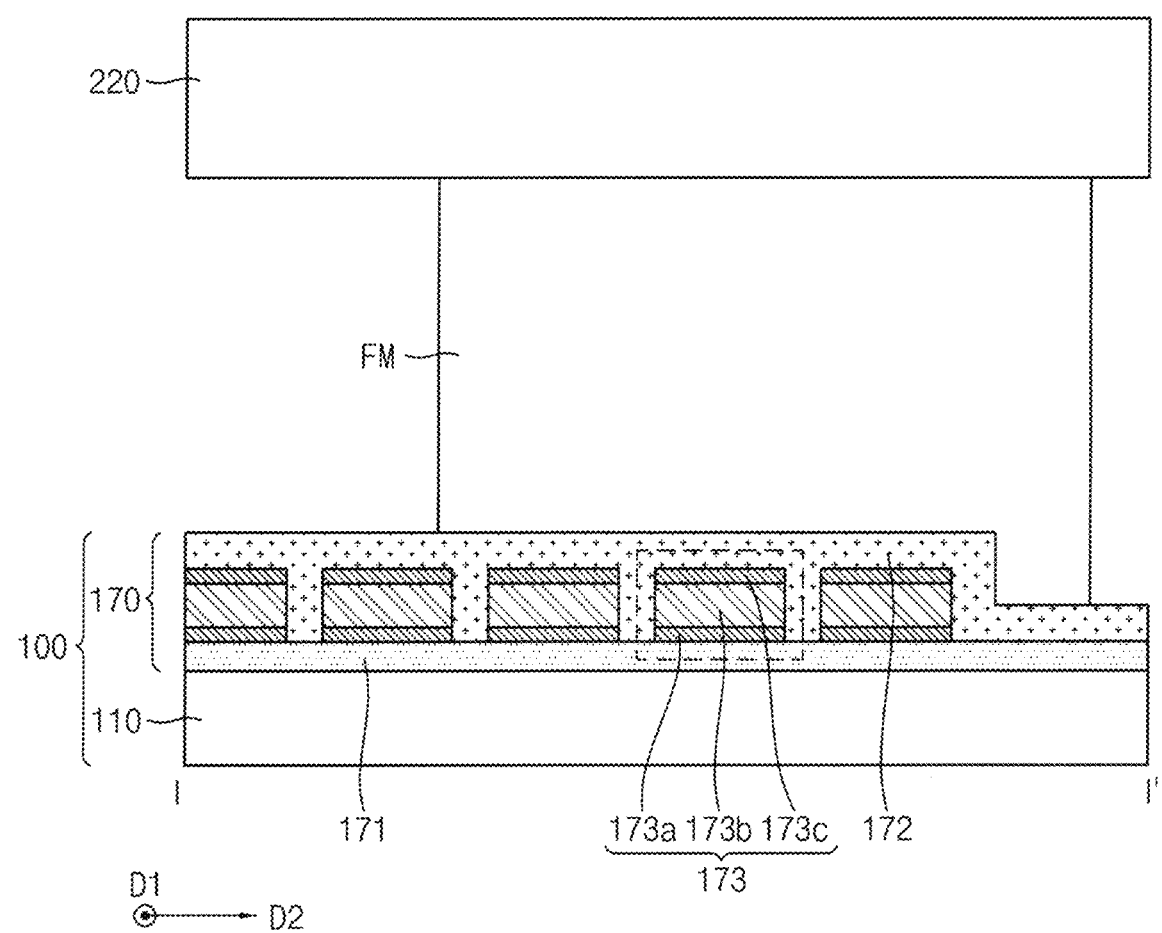

Referring to FIG. 7, a cover substrate 220 is disposed on the filling frit FF. The filling frit FF are heated by heat, UV, laser or the like. As a result, the array substrate 100 and the cover substrate 220 are combined with each other, and the filling frit FF are sintered to form the filling member FM.

The binder and the solvent in the filling frit FF may be removed in the process of drying or sintering. Thus, the filling member FM may substantially consist of inorganic materials.

For example, the filling member FM may be formed with a sealing member disposed in a sealing area. Furthermore, after the filling frit FF is provided on a surface of the cover substrate 220, and the cover substrate 220 and the array substrate 100 may be combined with each other.

Figure 8:
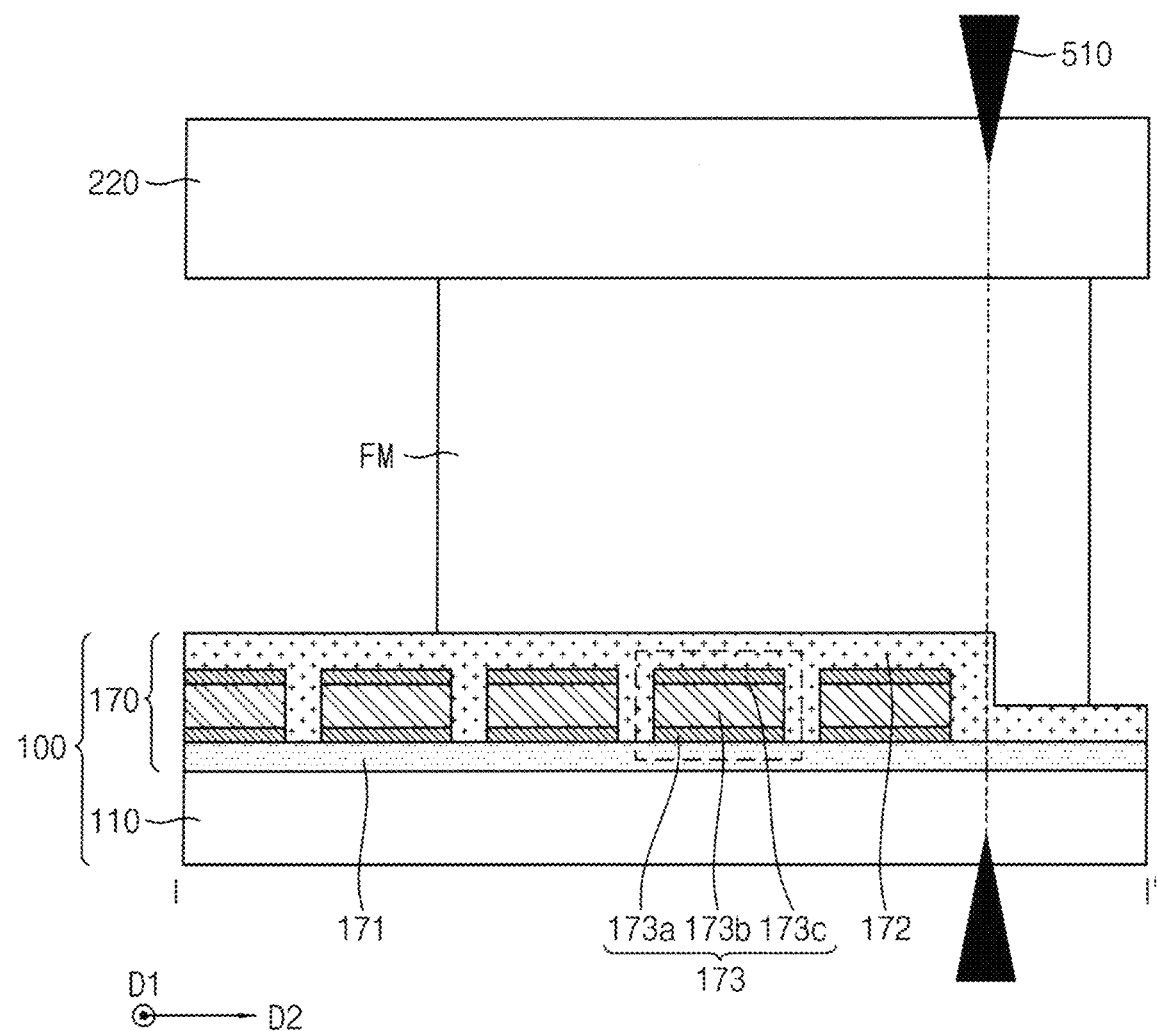

Referring to FIG. 8, the display panel may be scribed. For example, the display panel may be scribed by a scribing member 510 such as a scribing wheel or the like. In an embodiment, the scribing member 510 may scribe the display panel along a direction (i.e., thickness direction) vertical to an upper surface or a lower surface of the display panel.

In an embodiment, the cover substrate 220, the filling member FM, the side terminal 170 and the base substrate 110 of the array substrate may be scribed.

Figure 9:
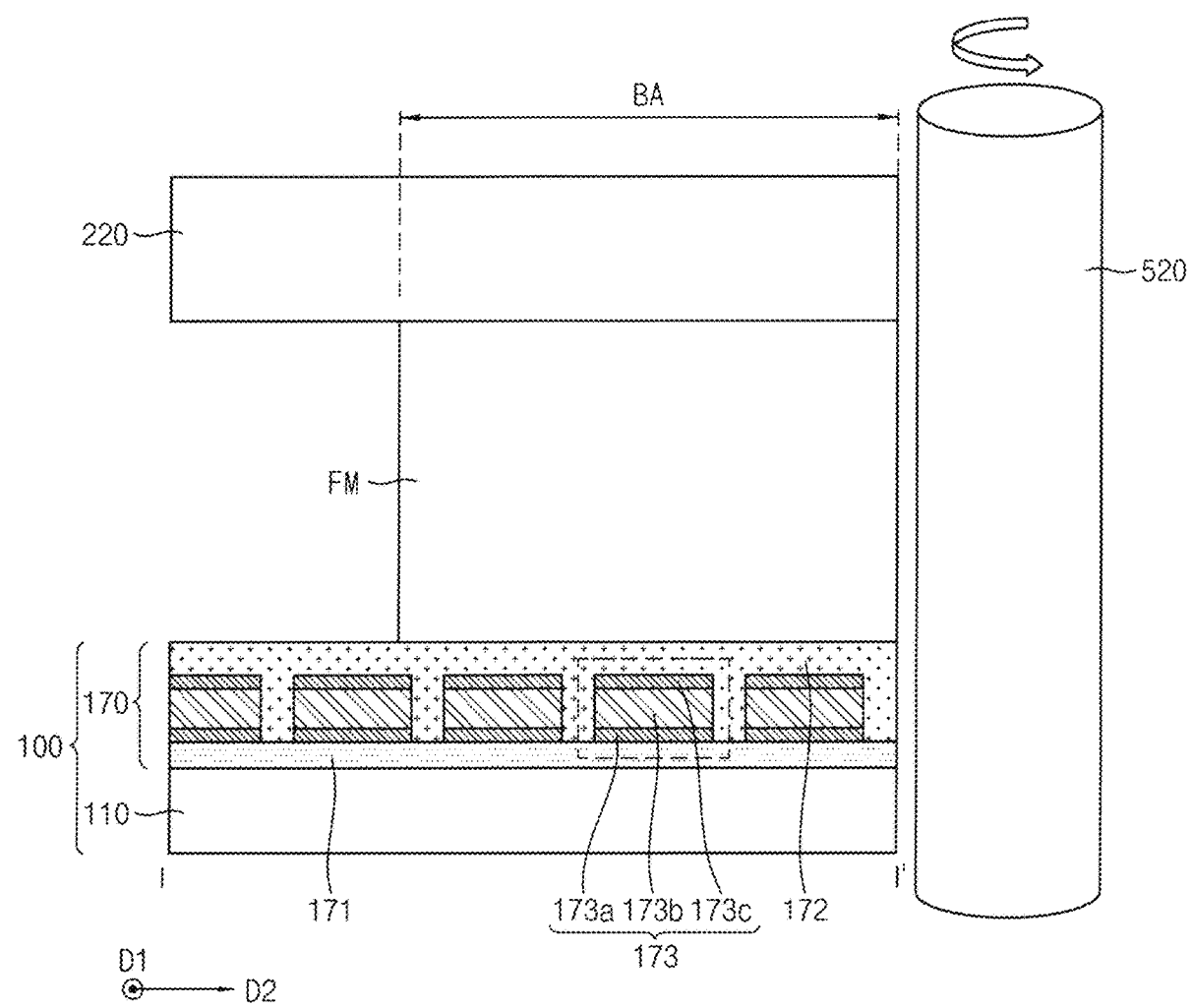

Referring to FIG. 9, the side surface of the display panel may be polished (or grinded) after scribing. A grinder 520 or a polishing machine may be used for grinding or polishing the side surface of the display panel. A roughness of the side surface of the display panel may be reduced through the grinding or polishing process.

Figure 10:
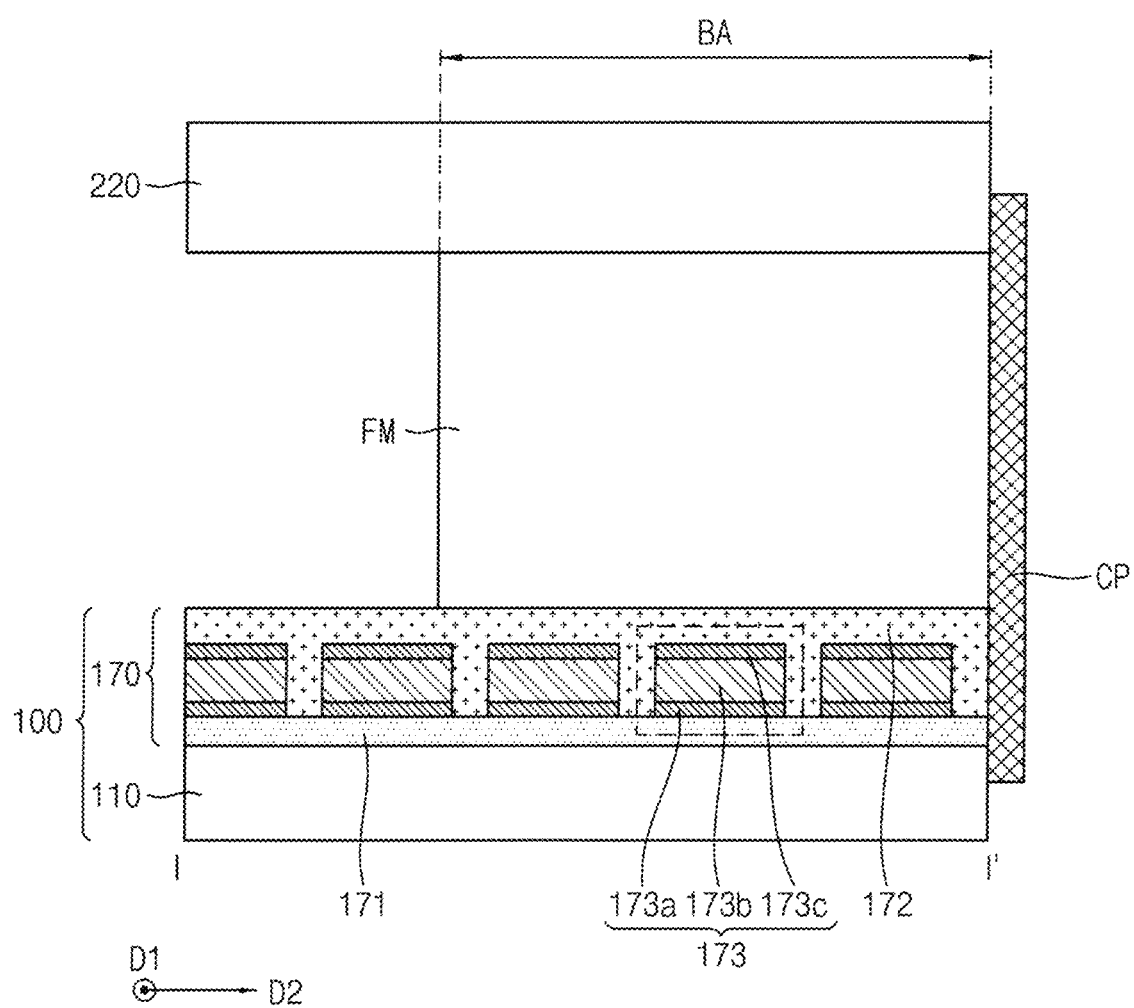

Referring to FIG. 10, a connection pad CP is formed on the side surface of the display panel, through which the side terminal 170 is exposed.

For example, a metal layer is formed on the side surface of the display panel through a deposition process such as sputtering or the like, and then patterned by laser or the like to form the connection pad CP.

Thereafter, as illustrated in FIG. 4, the connection pad CP is combined with an external driving device by an anisotropic conductive film, supersonic welding or the like. As a result, the external driving device may be electrically connected to a transfer wiring through the side terminal 170 and the connection pad CP.

FIGS. 11, 12, 13, 14 and 15 are cross-sectional views illustrating a display device according to other embodiments. FIGS. 11, 12, 13, 14 and 15 may illustrate a bonding area of a display device taken along line I-I' of FIG. 1.

Figure 11:
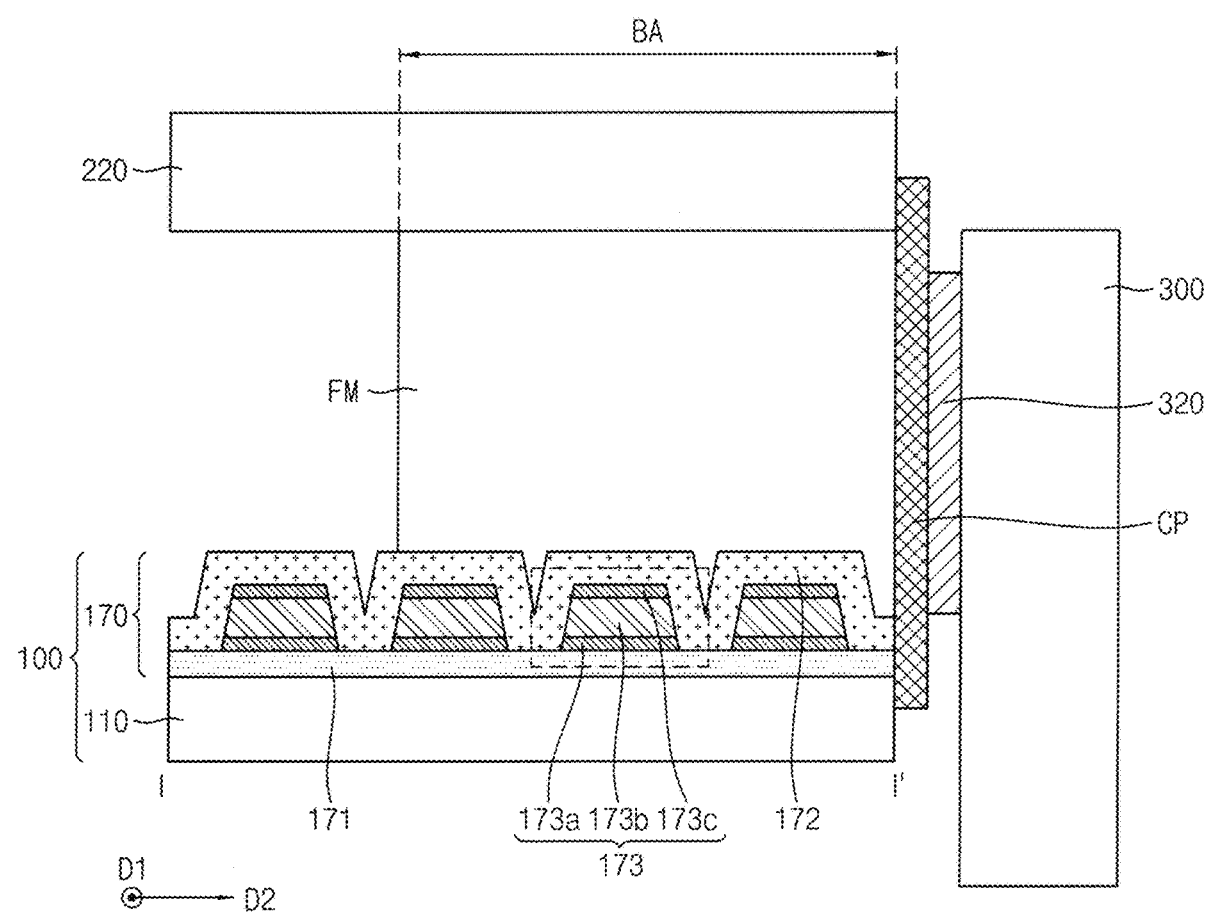
FIGS. 11, 12, 13, 14 and 15 are cross-sectional views illustrating a display device taken along line I-I' of FIG. 1 according to other embodiments.

Referring to FIG. 11, a display device includes an array substrate 100, a cover substrate 220, a filling member FM, and a connection pad CP.

The array substrate 100 includes a pixel array and a side terminal 170 electrically connected to the pixel array. The cover substrate 220 is combined with the array substrate 100. The connection pad CP contacts a side surface of the side terminal 170. An external driving device such as a flexible printed circuit film 300 is bonded to the connection pad CP.

In an embodiment, the side terminal 170 includes a lower conductive layer 171, an upper conductive layer 172, and a resistance-reducing layer 173 disposed between the lower conductive layer 171 and the upper conductive layer 172. The resistance-reducing layer 173 may include a plurality of patterns spaced apart from each other along the second direction D2. The resistance-reducing layer 173 may be spaced apart from the connection pad CP, and the upper conductive layer 172 and the lower conductive layer 171 may contact the connection pad CP.

In an embodiment, when the resistance-reducing layer 173 may be formed through wet-etching, each of the patterns of the resistance-reducing layer 173 may have a tapered shape.

For example, a taper angle of the patterns, which is formed by a side surface and a lower surface, may be about 60 degrees (°) to about 85°.

Figure 12:
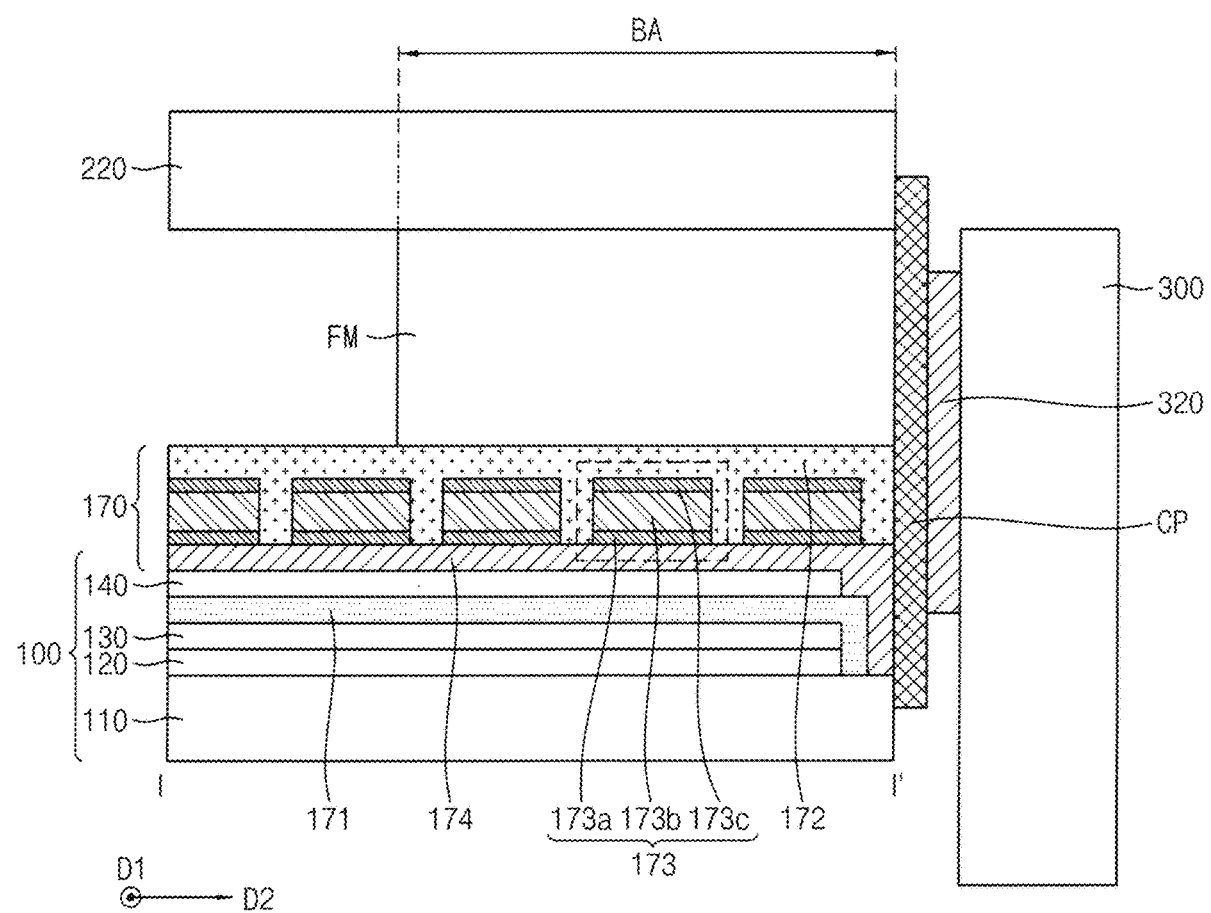

Referring to FIG. 12, a side terminal 170 includes a first lower conductive layer 171, a second lower conductive layer 174, an upper conductive layer 172, and a resistance-reducing layer 173 disposed between the second lower conductive layer 174 and the upper conductive layer 172. The resistance-reducing layer 173 may include a plurality of patterns spaced apart from each other along the second direction D2. The resistance-reducing layer 173 may be spaced apart from the connection pad CP.

In an embodiment, the first lower conductive layer 171 may be formed from the first gate metal pattern disposed in the display area DA, and the second lower conductive layer 174 may be formed from the second gate metal pattern disposed in the display area DA.

The buffer layer 120 and the first insulation layer 130 may be disposed under the first lower conductive layer 171. The second insulation layer 140 may be disposed between the first lower conductive layer 171 and the second lower conductive layer 174.

In an embodiment, ends of the buffer layer 120 and the insulation layers 130 and 140 may be spaced apart from the side surface of the display panel 10. Thus, the first lower conductive layer 171 and the second lower conductive layer 174 may extend along a vertical direction (i.e., a thickness direction of the base substrate 110) in an area where the connection pad CP contacts the side terminal 170. Thus, a size of an area where the side terminal 170 and the connection pad CP contacts each other may be increased. Furthermore, crack of inorganic layers and inorganic particles from the inorganic layers may be prevented.

Embodiments according to the invention are not limited to the above illustrated configurations. Embodiments may have various configurations to increase a contact area of a side terminal and a connection pad.

Figure 13:
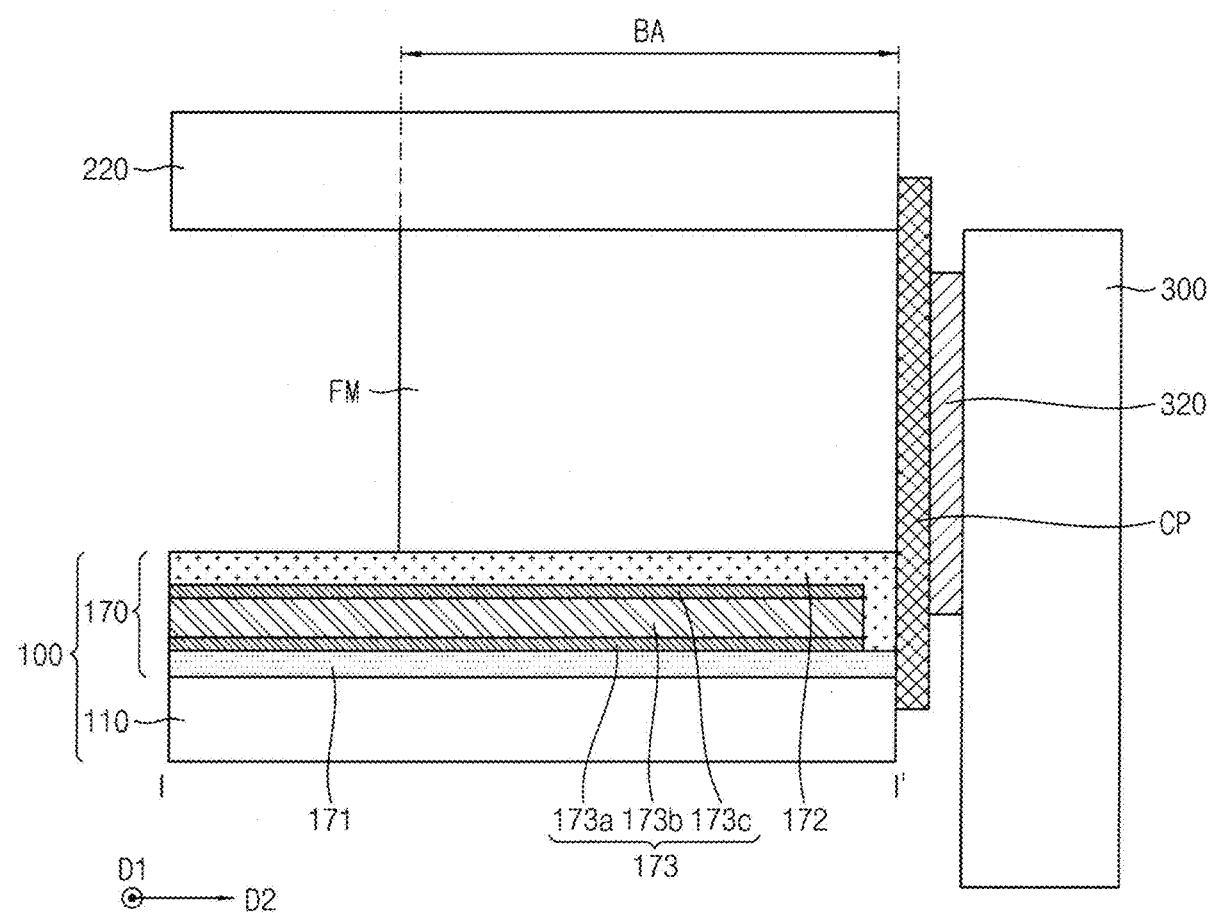

Referring to FIG. 13, a side terminal 170 includes a lower conductive layer 171, an upper conductive layer 172, and a resistance-reducing layer 173 disposed between the lower conductive layer 171 and the upper conductive layer 172. As illustrated, the resistance-reducing layer 173 may have a layer shape continuously extending in the second direction D2. The above configuration may further reduce a resistance of the side terminal 170.

Figure 14:
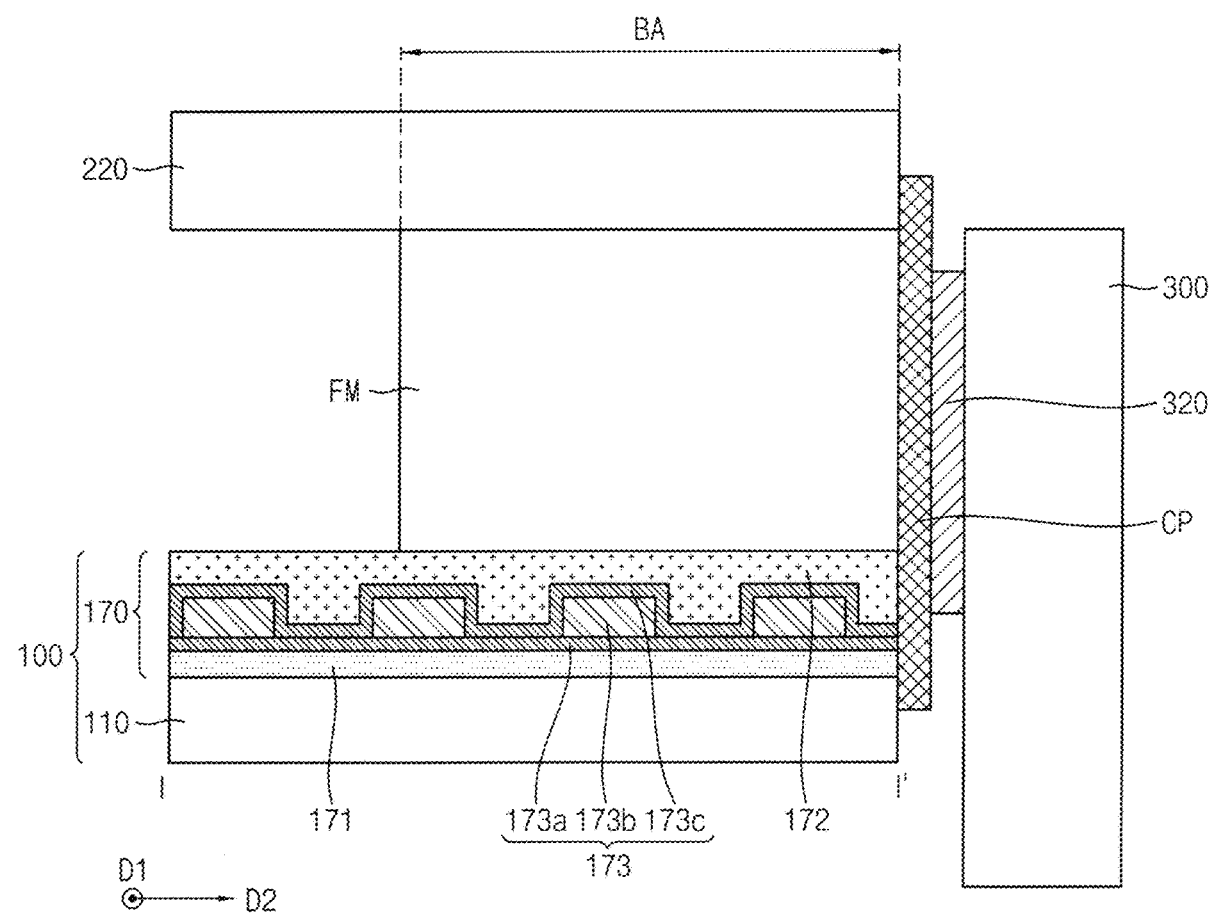

Referring to FIG. 14, a side terminal 170 includes a lower conductive layer 171, an upper conductive layer 172, and a resistance-reducing layer 173 disposed between the lower conductive layer 171 and the upper conductive layer 172.

The resistance-reducing layer 173 may include a main conductive layer 173b including a plurality of patterns spaced apart from each other in the second direction D2 and an upper capping layer 173c continuously covering the patterns of the main conductive layer 173b. The resistance-reducing layer 173 may further include a lower capping layer 173a disposed under the main conductive layer 173b. Here, each of the lower capping layer 173a and the upper capping layer 173c is monolithic to cover the plurality of patterns of the main conductive layer 173b.

The main conductive layer 173b may be spaced apart from the connection pad CP. The upper capping layer 173c may extend to the side surface of the display panel 10 to contact the connection pad CP.

Figure 15:
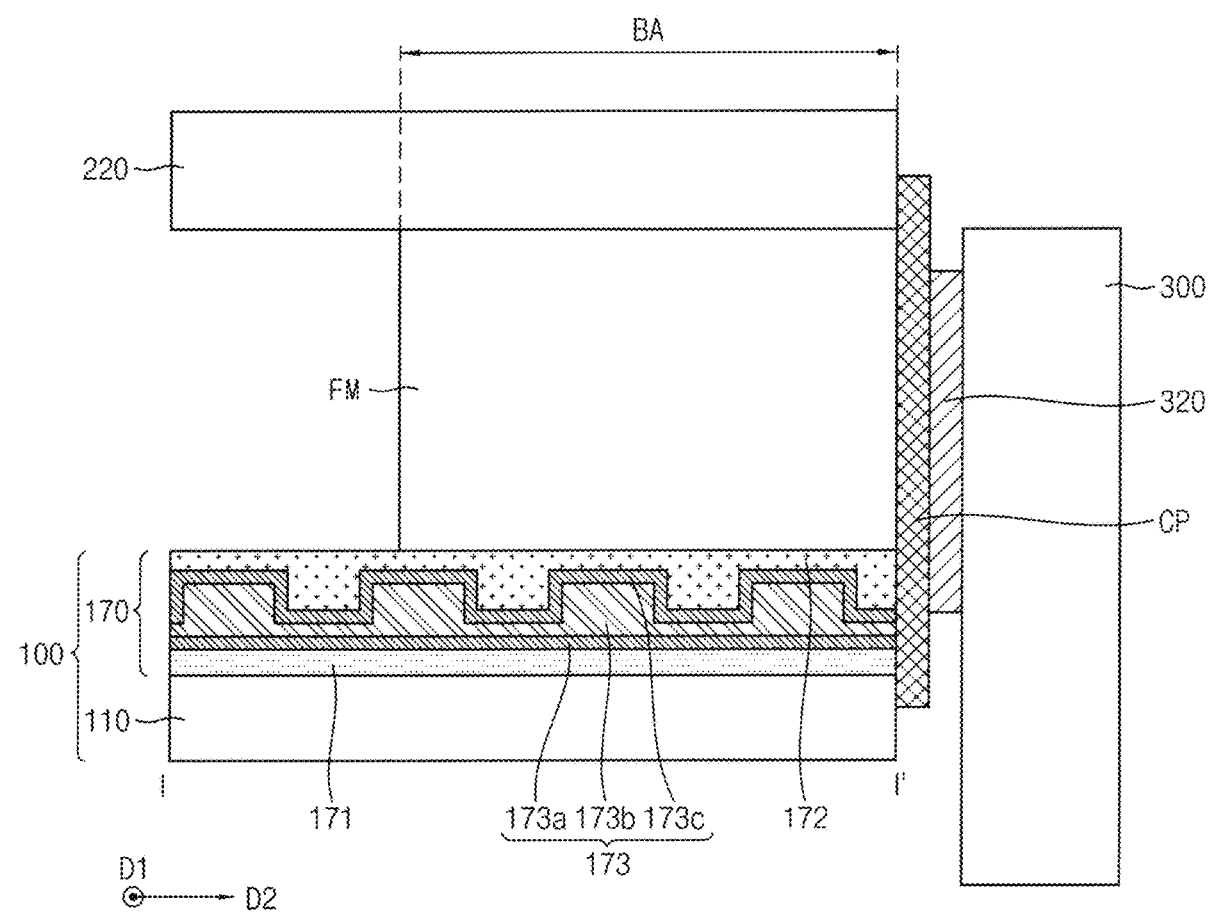

Referring to FIG. 15, a side terminal 170 includes a lower conductive layer 171, an upper conductive layer 172, and a resistance-reducing layer 173 disposed between the lower conductive layer 171 and the upper conductive layer 172.

The resistance-reducing layer 173 may include a main conductive layer 173b having an uneven profile.

When the upper capping layer 173c extends to cover a side surface of the main conductive layer 173b as illustrated in FIGS. 14 and 15, the upper conductive layer 172 may be omitted in an embodiment. Thus, in the embodiments, the main conductive layer 173b may be referred as to a resistance-reducing layer, and the upper capping layer 173c may be referred as to an upper conductive layer.

FIGS. 16, 17, 18, 19 and 20 are cross-sectional views illustrating a display device according to embodiments. FIGS. 16, 17, 18, 19 and 20 may illustrate a bonding area of a display device.

Figure 16:
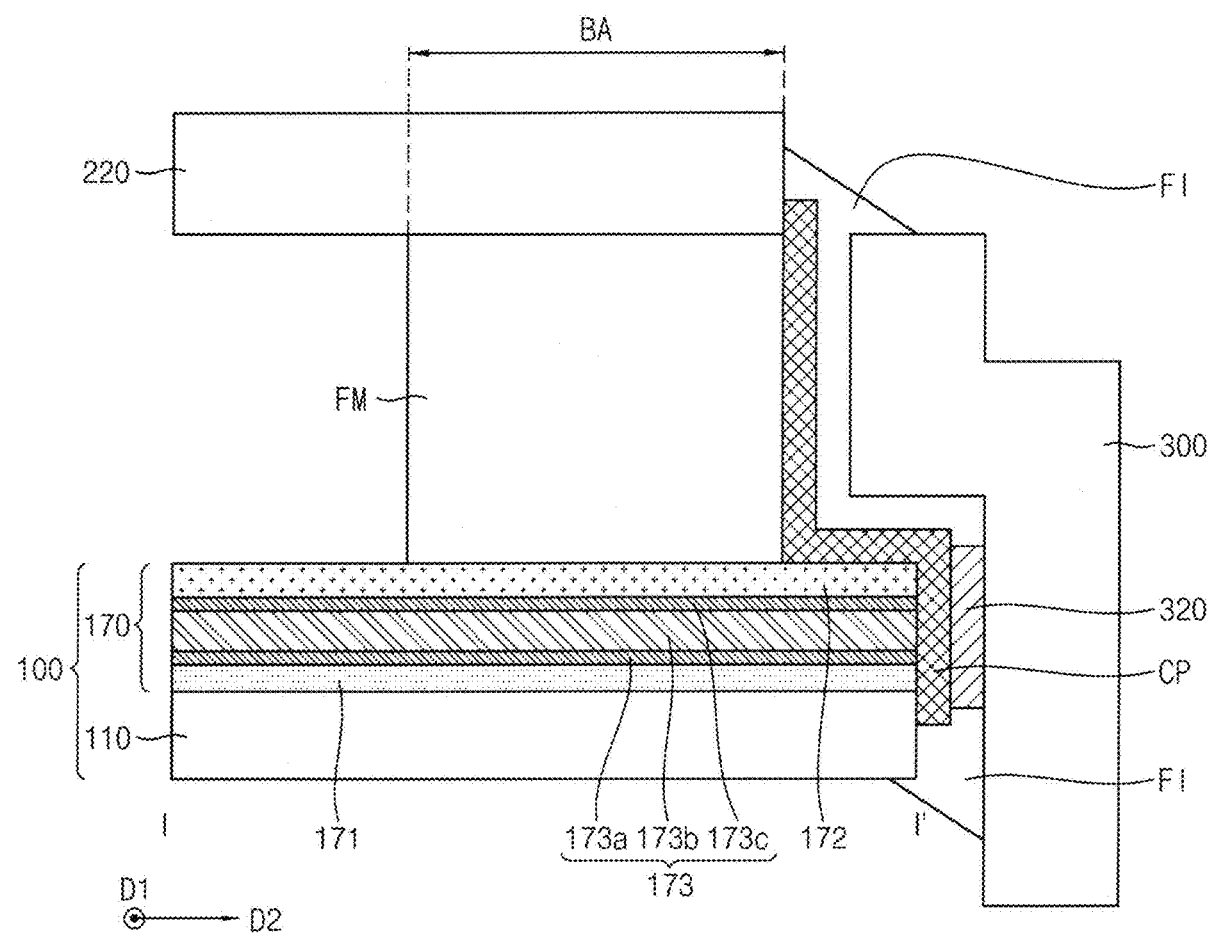
FIGS. 16, 17, 18, 19 and 20 are cross-sectional views illustrating a display device according to embodiments.

Referring to FIG. 16, a display device includes an array substrate 100, a cover substrate 220, a filling member FM, and a connection pad CP.

The array substrate 100 includes a pixel array and a side terminal 170 electrically connected to the pixel array. The cover substrate 220 is combined with the array substrate 100. The array substrate 100 may protrude from a side surface of the cover substrate 220 or a side surface of the filling member FM in a lateral direction (i.e., the second direction D2).

The connection pad CP contacts a side surface and an upper surface of the side terminal 170. For example, the connection pad CP may extend along the side surface and the upper surface of the side terminal 170 to form a conformal contact with the side terminal 170. An external driving device such as a flexible printed circuit film 300 is bonded to the connection pad CP. Since the flexible printed circuit film 300 is flexible, the flexible printed circuit film 300 may be curved or bended along the side surface of the display panel 10. A conductive connection member 320 is provided between the connection pad CP and the flexible printed circuit film 300. The conductive connection member 320 may extend over the upper surface of the side terminal 170 along the connection pad CP, in another embodiment.

In an embodiment, an adhesion member FI may be provided between the flexible printed circuit film 300 and the display panel 10. The adhesion member FI may protect the side bonding area and may increase adhesion of the flexible printed circuit film 300 and the display panel 10. For example, the adhesion member FI may be formed from a curable resin such as an epoxy resin, a silicone resin, an acrylic resin, an urethane resin, a phenolic resin or the like.

In an embodiment, the side terminal 170 includes a lower conductive layer 171, an upper conductive layer 172, and a resistance-reducing layer 173 disposed between the lower conductive layer 171 and the upper conductive layer 172.

As the side terminal 170 protrudes in a lateral direction (i.e., the second direction D2), an upper surface of the upper conductive layer 172 may contact the connection pad CP. Thus, even if a side surface of the resistance-reducing layer 173 is oxidized, a resistance of the side bonding area may not increase substantially.

Figure 17:
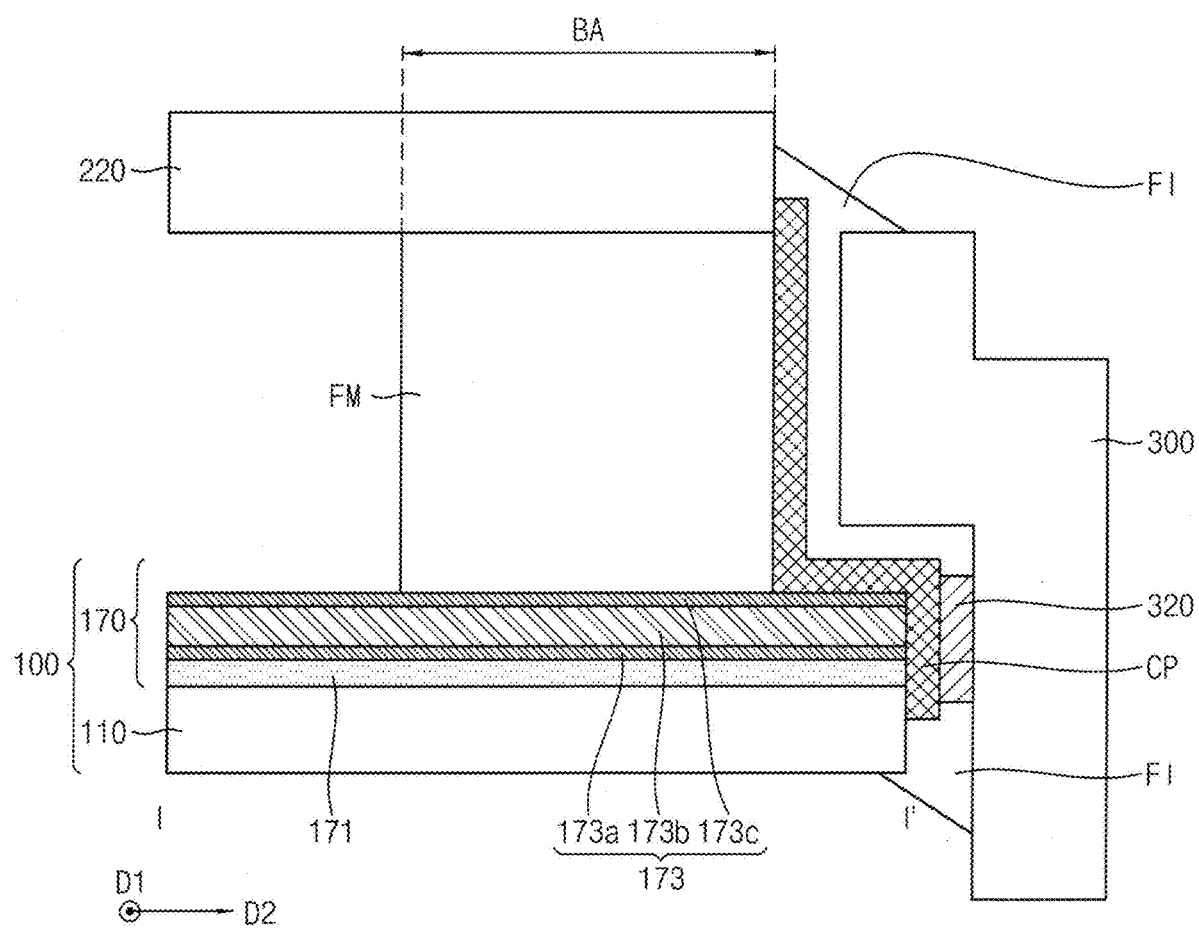

Referring to FIG. 17, an array substrate 100 including a side terminal 170 may protrude from a side surface of a cover substrate 220 in a lateral direction (i.e., the second direction D2). The side terminal 170 may include a resistance-reducing layer 173 without an upper conductive layer covering the resistance-reducing layer 173. Thus, an upper surface of the resistance-reducing layer 173 may contact a connection pad CP. The resistance-reducing layer 173 includes a main conductive layer 173b and an upper capping layer 173c covering an upper surface of the main conductive layer 173b. Since the upper capping layer 173c may include a material having a high-oxidation-resistance material such as titanium, the upper capping layer 173c may function as the upper conductive layer. Thus, even if a side surface of the resistance-reducing layer 173 is oxidized, a resistance of a side bonding area may not be increased substantially.

Figure 18:
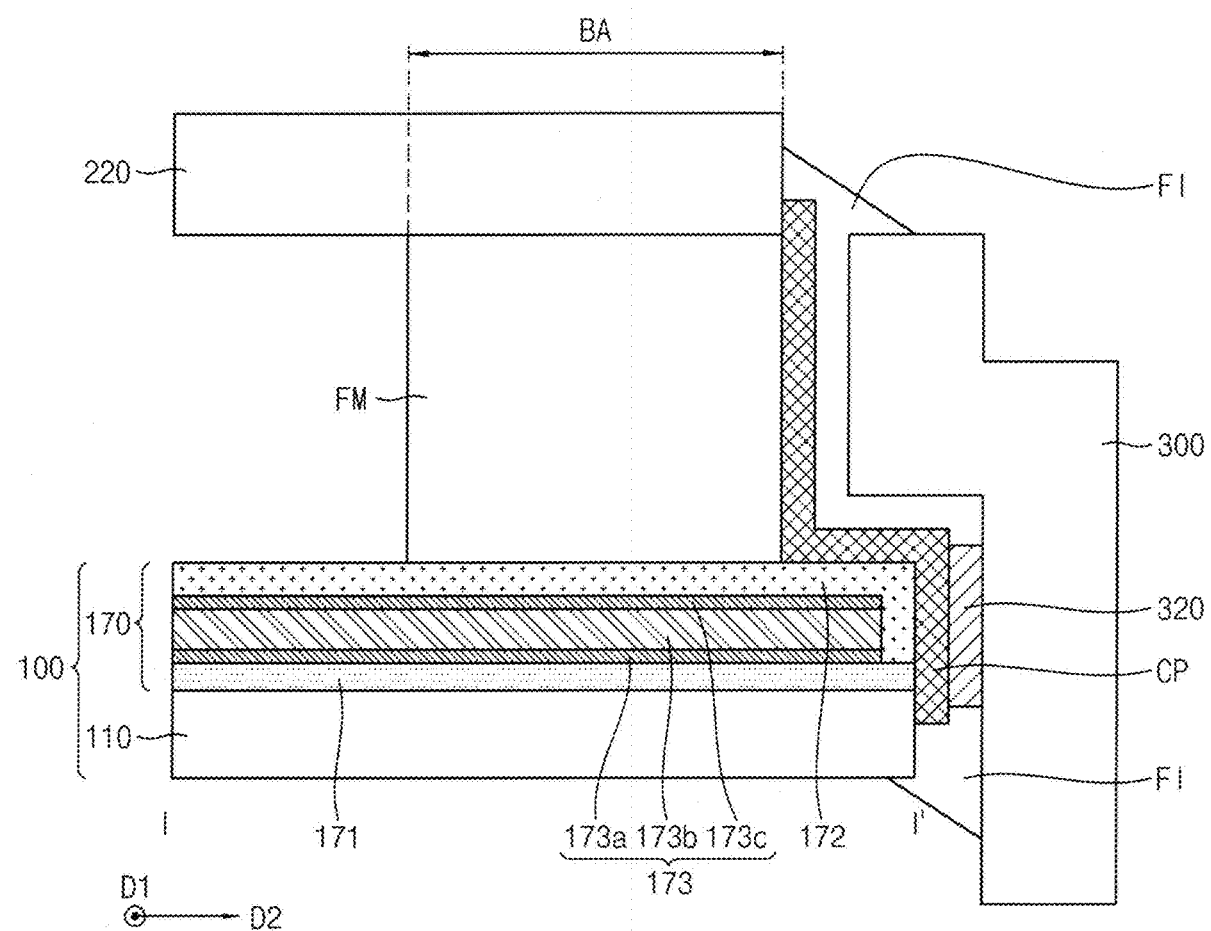

Referring to FIG. 18, an array substrate 100 including a side terminal 170 may protrude from a side surface of a cover substrate 220 in a lateral direction (i.e., the second direction D2). The side terminal 170 may include a resistance-reducing layer 173 and an upper conductive layer 172 disposed on the resistance-reducing layer 173. The upper conductive layer 172 further covers a side surface of the resistance-reducing layer 173 such that the resistance-reducing layer 173 is spaced apart from the connection pad CP. Thus, oxidation of a side surface of the resistance-reducing layer 173 may be prevented, and a resistance of a side bonding area may be reduced.

Figure 19:
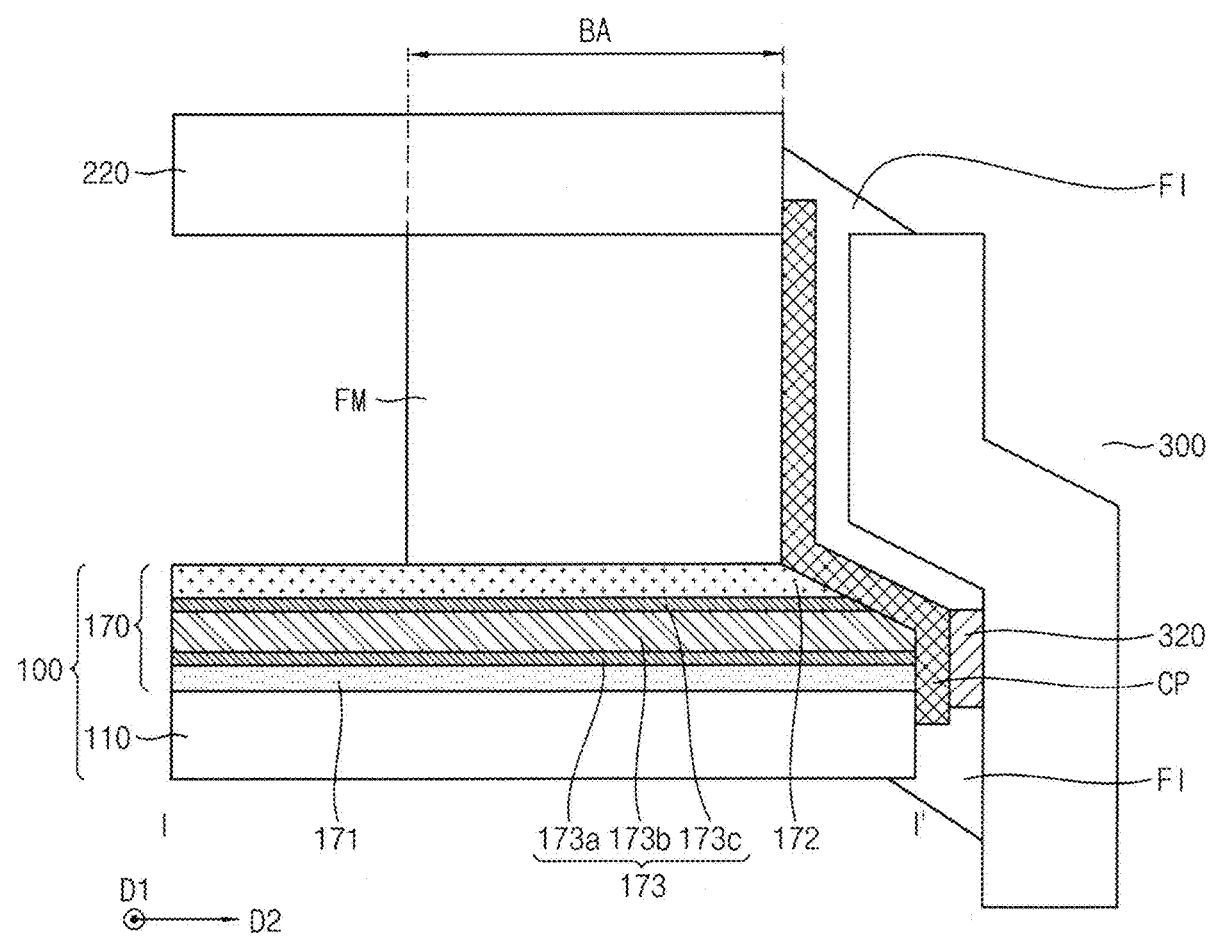

Referring to FIG. 19, an array substrate 100 including a side terminal 170 may protrude from a side surface of a cover substrate 220 in a lateral direction (i.e., the second direction D2). An exposed corner of the side terminal 170, which is connected to an upper surface and a side surface of the side terminal 170 and contacts a connection pad CP, may have a chamfered shape or a round shape. Thus, disconnection of the connection pad CP in a deposition process may be prevented. Thus, reliability of a side bonding structure may be improved. The corner may be formed by a grinder or the like.

Figure 20:
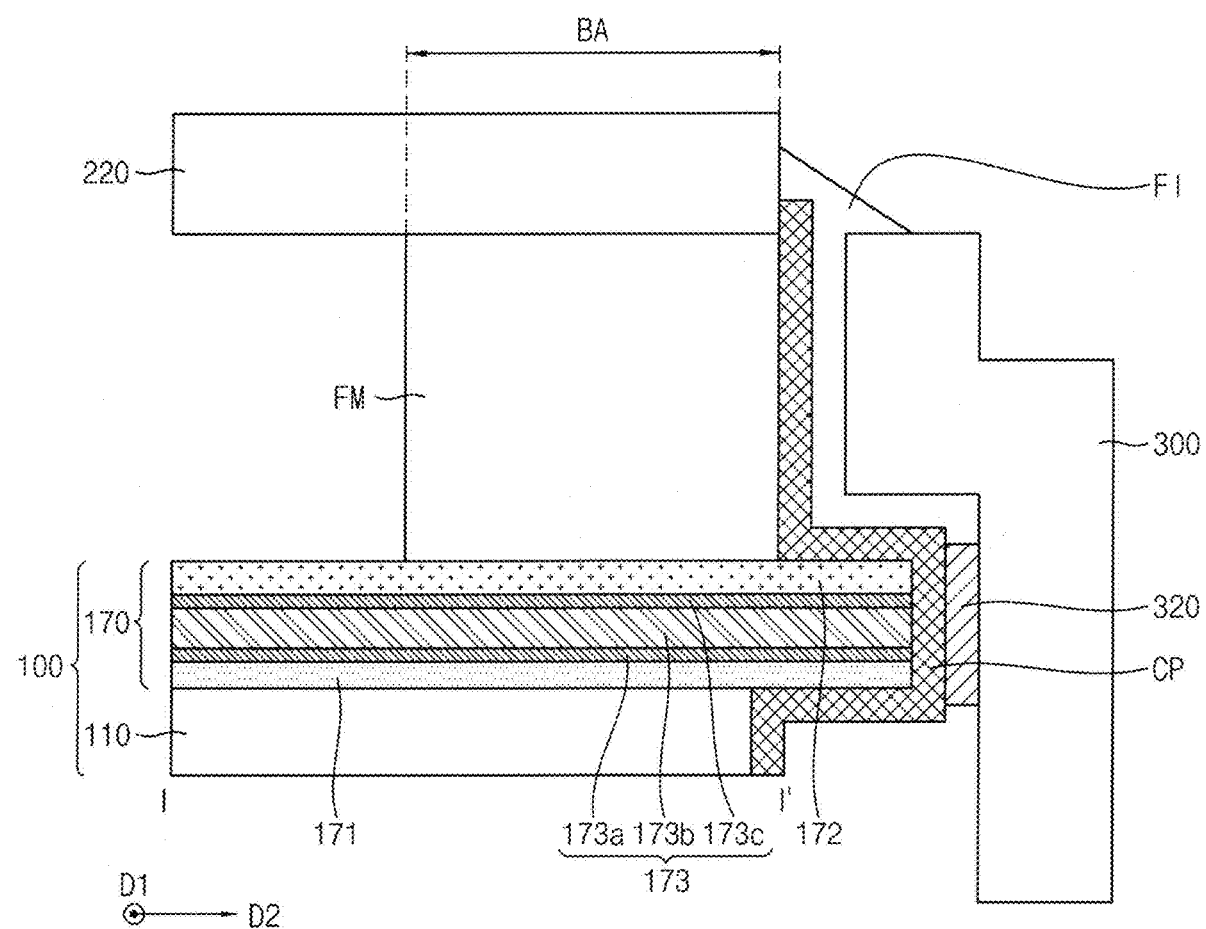

Referring to FIG. 20, a side terminal 170 may protrude from a cover substrate 220 and a base substrate 110 of an array substrate 100. Thus, an upper surface and a lower surface of the side terminal 170 may contact a connection pad CP. Thus, a contact area of the side terminal 170 and the connection pad CP may be increased.

The above embodiments provides an organic-light emitting display device. However, embodiments according to the invention are not limited thereto. For example, embodiments may be applied for a bonding structure of display devices such as a liquid crystal display device, an electroluminescent display device, a micro LED display device, or the like in another embodiment.

Furthermore, embodiments may include a display device including a thin film encapsulation layer or a flexible window instead of a rigid cover substrate.

Furthermore, embodiments may include a display device having a flexible base substrate.

Embodiments may be applied to various display devices. For example, embodiment may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the present inventive concept. Accordingly, all such modifications are intended to be included within the scope of the present inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the present inventive concept, as set forth in the following claims and equivalents thereof

What is claimed is:

1. A display device comprising:
a pixel array disposed on a base substrate;
a side terminal electrically connected to the pixel array;
a connection pad including a first side surface contacting a side surface of the side terminal; and
a driving device bonding to a second side surface of the connection pad, the second side surface being opposite to the first side surface,
wherein the side terminal includes a resistance-reducing layer and an upper conductive layer, the resistance-reducing layer includes a first conductive material, and the upper conductive layer is disposed on the resistance-reducing layer and includes a second conductive material having an oxidation resistance greater than the first conductive material,
wherein a portion of the upper conductive layer is disposed between the connection pad and the resistance-reducing layer such that the resistance-reducing layer is spaced apart from the connection pad.

2. The display device of claim 1, wherein the first conductive material includes at least one of aluminum and copper.

3. The display device of claim 2, wherein the second conductive material includes at least one of silver, titanium, molybdenum, nickel, chrome and a conductive oxide.

4. The display device of claim 1, wherein the resistance-reducing layer includes a main conductive layer and an upper capping layer, the main conductive layer includes the first conductive material, and the upper capping layer is disposed on the main conductive layer and includes the second conductive material.

5. The display device of claim 1, wherein the resistance-reducing layer includes a plurality of patterns spaced apart from each other.

6. The display device of claim 1, wherein the side terminal further includes a lower conductive layer disposed under the resistance-reducing layer and including the second conductive material.

7. The display device of claim 6, wherein the lower conductive layer includes a first lower conductive layer and a second lower conductive layer disposed on the first lower conductive layer.

8. The display device of claim 6, wherein an insulation layer is disposed between the lower conductive layer and the base substrate, and a portion of the lower conductive layer is disposed between the insulation layer and the connection pad such that the insulation layer is spaced apart from the connection pad.

9. The display device of claim 1, further comprising:
a cover substrate disposed on the side terminal; and
a filling member disposed between the side terminal and the cover substrate.

10. The display device of claim 9, wherein the connection pad extends to contact a side surface of the filling member.

11. The display device of claim 1, wherein the first conductive material includes aluminum, and the second conductive material includes titanium.

12. The display device of claim 1, wherein the first conductive material includes aluminum, and the second conductive material includes silver.

13. A display device comprising:
- a pixel array disposed on a base substrate;
- a side terminal electrically connected to the pixel array; and
- a connection pad contacting a side surface of the side terminal and vertically extending to contact a side surface of the base substrate,
- wherein the side terminal includes a resistance-reducing layer and an upper conductive layer, the resistance-reducing layer includes a first conductive material, and the upper conductive layer is disposed on the resistance-reducing layer and includes a second conductive material having an oxidation resistance greater than the first conductive material,
- wherein a portion of the upper conductive layer is disposed between the connection pad and the resistance-reducing layer.

14. The display device of claim 13, wherein the first conductive material includes at least one of aluminum and copper, and the second conductive material includes at least one of silver, titanium, molybdenum, nickel, chrome and a conductive oxide.

15. The display device of claim 13, further comprising a flexible printed circuit film bonded to a side surface of the connection pad.

* * * * *